United States Patent
Koolen et al.

(10) Patent No.: US 12,405,535 B2
(45) Date of Patent: Sep. 2, 2025

(54) METHOD FOR FILTERING AN IMAGE AND ASSOCIATED METROLOGY APPARATUS

(71) Applicants: ASML Holding N.V., Veldhoven (NL); ASML Netherlands B.V., Veldhoven (NL)

(72) Inventors: Armand Eugene Albert Koolen, Nuth (NL); Justin Lloyd Kreuzer, Trumbull, CT (US); Nikhil Mehta, Stamford, CT (US); Patrick Warnaar, Tilburg (NL); Vasco Tomas Tenner, Amsterdam (NL); Patricius Aloysius Jacobus Tinnemans, Hapert (NL); Hugo Augustinus Joseph Cramer, Eindhoven (NL)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 838 days.

(21) Appl. No.: 17/761,475

(22) PCT Filed: Sep. 3, 2020

(86) PCT No.: PCT/EP2020/074621
§ 371 (c)(1),
(2) Date: Mar. 17, 2022

(87) PCT Pub. No.: WO2021/052772
PCT Pub. Date: Mar. 25, 2021

(65) Prior Publication Data
US 2022/0350260 A1    Nov. 3, 2022

Related U.S. Application Data

(60) Provisional application No. 62/901,938, filed on Sep. 18, 2019.

(30) Foreign Application Priority Data

Oct. 16, 2019 (EP) .................................. 19203613

(51) Int. Cl.
G03F 7/00 (2006.01)
G01N 21/95 (2006.01)
G01N 21/956 (2006.01)

(52) U.S. Cl.
CPC ..... *G03F 7/70508* (2013.01); *G01N 21/9501* (2013.01); *G01N 21/95623* (2013.01); *G03F 7/706837* (2023.05)

(58) Field of Classification Search
CPC .......... G01N 21/9501; G01N 21/95623; G03F 7/70508; G03F 7/70633; G03F 7/706837
See application file for complete search history.

(56) References Cited

U.S. PATENT DOCUMENTS 6,952,253 B2    10/2005  Lof et al.
7,701,577 B2     4/2010  Straaijer et al.
(Continued)

FOREIGN PATENT DOCUMENTS

EP    1 628 164 A2    2/2006
EP    3 531 191 A1    8/2019
(Continued)

OTHER PUBLICATIONS

International Search Report and Written Opinion of the International Searching Authority directed to related International Patent Application No. PCT/EP2020/074621, mailed Dec. 21, 2020; 9 pages.

*Primary Examiner* — Deoram Persaud
(74) *Attorney, Agent, or Firm* — Sterne, Kessler, Goldstein & Fox P.L.L.C.

(57) ABSTRACT

Disclosed is a method for a metrology measurement on an area of a substrate comprising at least a portion of a target (Continued)

structure. The method comprises receiving a radiation information representing a portion of radiation scattered by the are, and using a filter in a Fourier domain for removing or suppressing at least a portion of the received radiation information that does not relate to radiation that has been scattered by the target structure for obtaining a filtered radiation information for the metrology measurement, wherein characteristics of the filter are based on target information about the target structure.

15 Claims, 11 Drawing Sheets

(56) References Cited

U.S. PATENT DOCUMENTS

| | | |
|---|---|---|
| 7,791,724 B2 | 9/2010 | Den Boef et al. |
| 8,115,926 B2 | 2/2012 | Straaijer |
| 8,553,227 B2 | 10/2013 | Jordanoska |
| 8,681,312 B2 | 3/2014 | Straaijer |
| 8,692,994 B2 | 4/2014 | Straaijer |
| 8,792,096 B2 | 7/2014 | Straaijer |
| 8,823,922 B2 | 9/2014 | Den Boef |
| 9,417,534 B2* | 8/2016 | Lu .............................. G03F 1/32 |
| 10,739,687 B2 | 8/2020 | Smilde et al. |
| 2006/0066855 A1 | 3/2006 | Boef et al. |
| 2007/0121090 A1* | 5/2007 | Chen .................... G03F 7/70433 355/53 |
| 2008/0225298 A1* | 9/2008 | Fairley ............. G01N 21/95607 356/445 |
| 2010/0328655 A1 | 12/2010 | Den Boef et al. |
| 2011/0026032 A1 | 2/2011 | Den Boef et al. |
| 2011/0027704 A1 | 2/2011 | Cramer et al. |
| 2011/0102753 A1 | 5/2011 | Van De Kerkhof et al. |
| 2011/0249244 A1 | 10/2011 | Leewis et al. |
| 2012/0044470 A1 | 2/2012 | Smilde et al. |
| 2012/0274931 A1* | 11/2012 | Otani ..................... G01N 21/94 356/237.3 |
| 2013/0162996 A1 | 6/2013 | Straaijer et al. |
| 2014/0146297 A1* | 5/2014 | Vainer ....................... G03F 1/84 250/226 |
| 2016/0161863 A1 | 6/2016 | Den Boef et al. |
| 2016/0370717 A1 | 12/2016 | Den Boef et al. |
| 2017/0336198 A1 | 11/2017 | Adel et al. |
| 2019/0107781 A1 | 4/2019 | Tinnemans et al. |
| 2023/0064193 A1* | 3/2023 | Tinnemans ........... G03F 7/7065 |
| 2024/0027958 A1* | 1/2024 | Midtvedt ............. G03H 1/0465 |
| 2024/0345489 A1* | 10/2024 | Tenner ................. G03F 7/7065 |
| 2024/0361705 A1* | 10/2024 | Tarabrin ............... G03H 1/0866 |

FOREIGN PATENT DOCUMENTS

| | | |
|---|---|---|
| TW | 2017-12444 A | 4/2017 |
| WO | WO 2011/012624 A1 | 2/2011 |
| WO | WO 2019/068459 A1 | 4/2019 |

* cited by examiner

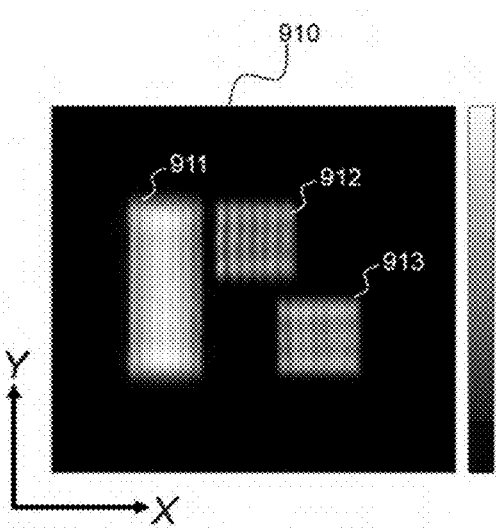
Fig. 9A
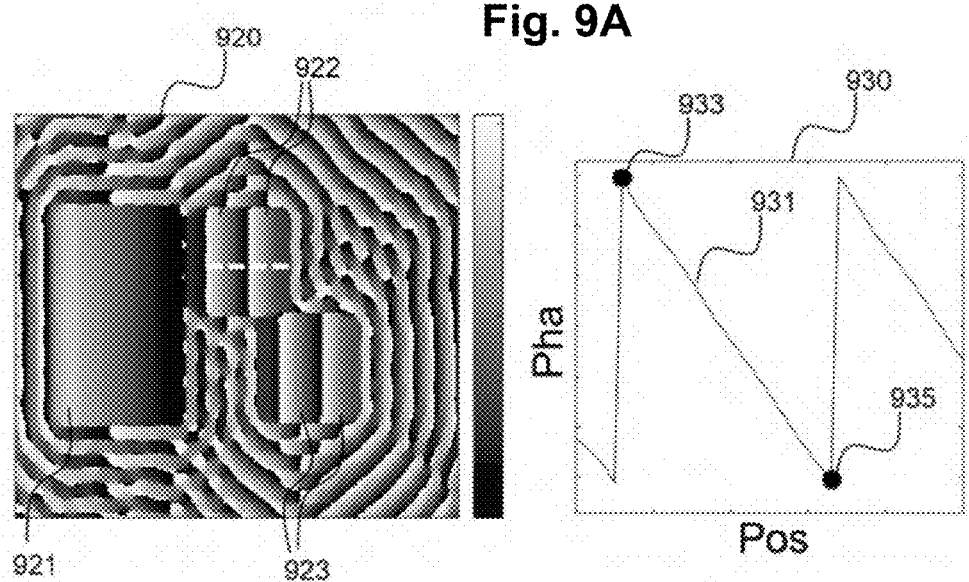
Fig. 9B
Fig. 9C

METHOD FOR FILTERING AN IMAGE AND ASSOCIATED METROLOGY APPARATUS

CROSS REFERENCE TO RELATED APPLICATIONS

This application claims priority of U.S. application 62/901,938 which was filed on 2019 Sep. 18 and EP application 19203613.5 which was filed on 2019 Oct. 16 and which is incorporated herein in its entirety by reference.

FIELD

The present invention relates to a method for determining a characteristic of structures on a substrate. The present invention also relates to a metrology apparatus or an inspection apparatus for determining a characteristic of structures on a substrate.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

During the manufacturing process there is a need to inspect the manufactured structures and/or to measure characteristics of the manufactured structures. Suitable inspection and metrology apparatuses are known in the art. One of the known metrology apparatuses is a scatterometer and, for example, a dark field scatterometer.

Patent application EP2019/063028, patent application publication US2010/0328655A1 and patent application publication US2006/0066855A1 discuss embodiments of a photolithographic apparatus and embodiments of a scatterometer. The cited documents are herein incorporated by reference in its entirety.

When measuring with a metrology device, crosstalk from structures (e.g., product structures) adjacent the target being measured has an impact on the measurement.

SUMMARY

It is an object to provide an effective an efficient solution for an inspection or metrology apparatus to help minimize measurement crosstalk between structures.

Embodiments are disclosed in the claims and in the detailed description.

There is provided a method for a metrology measurement on an area of a substrate comprising at least a portion of a target structure. The method comprises receiving a radiation information representing a portion of radiation scattered by the area, and using a filter in a Fourier domain for removing or suppressing at least a portion of the received radiation information that does not relate to radiation that has been scattered by the target structure for obtaining a filtered radiation information for the metrology measurement, wherein characteristics of the filter are based on target information about the target structure.

According to a second aspect there is provided a metrology apparatus for a metrology measurement on an area of a substrate comprising at least a portion of a target structure. The metrology apparatus is configured for i) receiving a radiation information representing at least a portion of radiation scattered by the area, and ii) using a filter in a Fourier domain for removing or suppressing at least a portion of the received radiation information that does not relate to radiation that has been scattered by the target structure for obtaining a filtered radiation information for the metrology measurement. Characteristics of the filter are based on target information about the target structure.

Also provided is a computer program product comprising instructions which cause, when executed at a processor, the execution of the method for a metrology measurement on an area of a substrate comprising at least a portion of a target structure. The method comprises receiving a radiation information representing a portion of radiation scattered by the are, and using a filter in a Fourier domain for removing or suppressing at least a portion of the received radiation information that does not relate to radiation that has been scattered by the target structure for obtaining a filtered radiation information for the metrology measurement, wherein characteristics of the filter are based on target information about the target structure.

BRIEF DESCRIPTION OF THE DRAWINGS

Embodiments will now be described, by way of example only, with reference to the accompanying schematic drawings, in which:

FIG. 8B a pupil image embodiment;

FIGS. 9A-9C show one embodiment of the complex electric field including FIG. 9A an intensity image, FIG. 9B a phase image, and FIG. 9C a chart showing a phase gradient, which is corresponding to the dashed line in FIG. 9B;

FIGS. 12A-12F show simulated result of one embodiment to compare effects with and without a filter, wherein FIG. 12A and FIG. 12D are intensity images before and after filtering respectively; FIG. 12B and FIG. 12E are pupil images before and after filtering respectively; FIG. 12C and FIG. 12F show overlay sensitivity plots with and without filtering respectively;

DETAILED DESCRIPTION

In the present document, the terms "radiation" and "beam" are used to encompass all types of electromagnetic radiation and particle radiation, including ultraviolet radiation (e.g. with a wavelength of 365, 248, 193, 157 or 126 nm), EUV (extreme ultra-violet radiation, e.g. having a wavelength in the range of about 5-100 nm), X-ray radiation, electron beam radiation and other particle radiation.

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
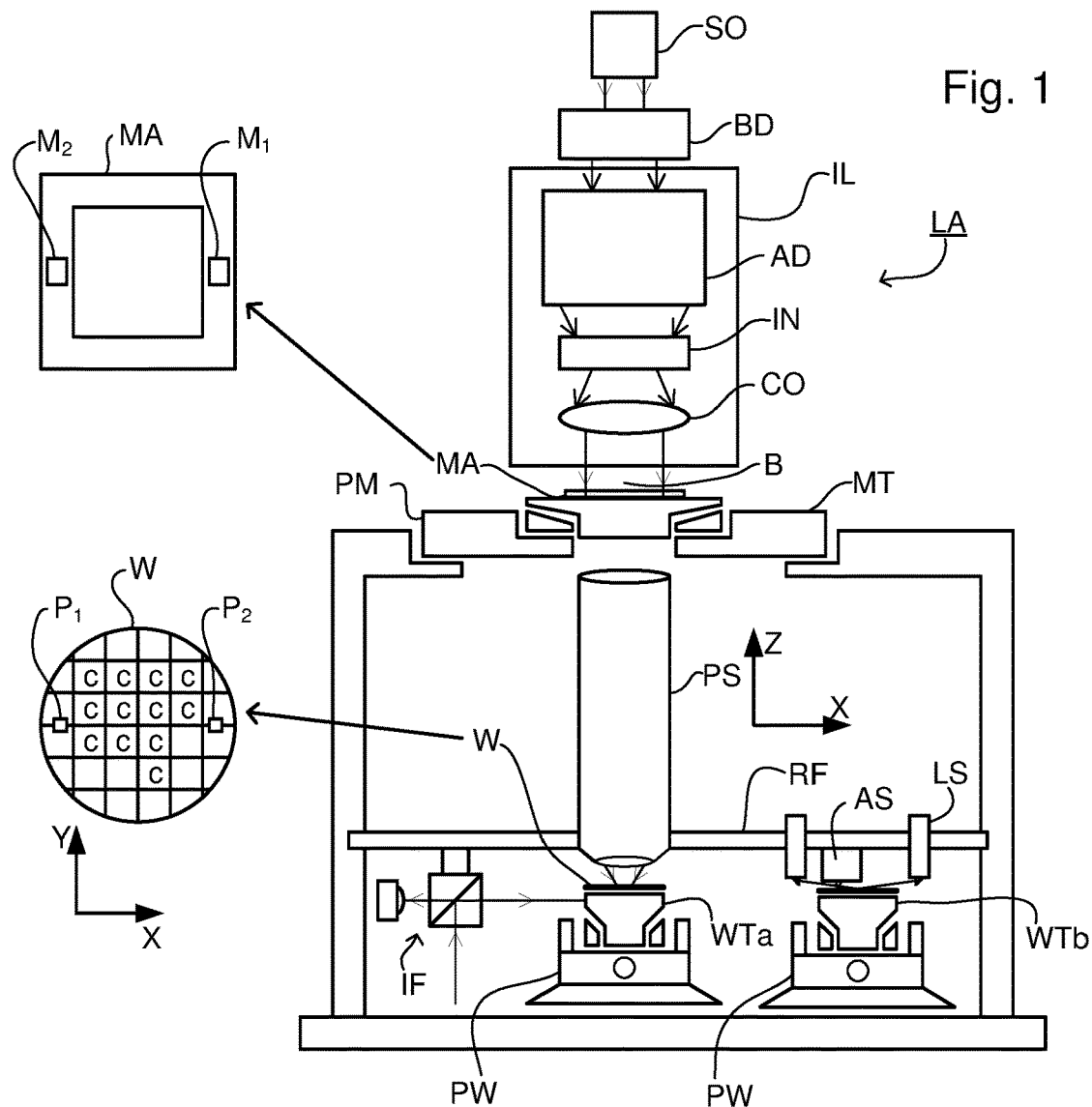
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation, EUV radiation or X-ray radiation), a mask support (e.g., a mask table) T constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, diffractive, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, diffractive, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference in its entirety.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support T, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
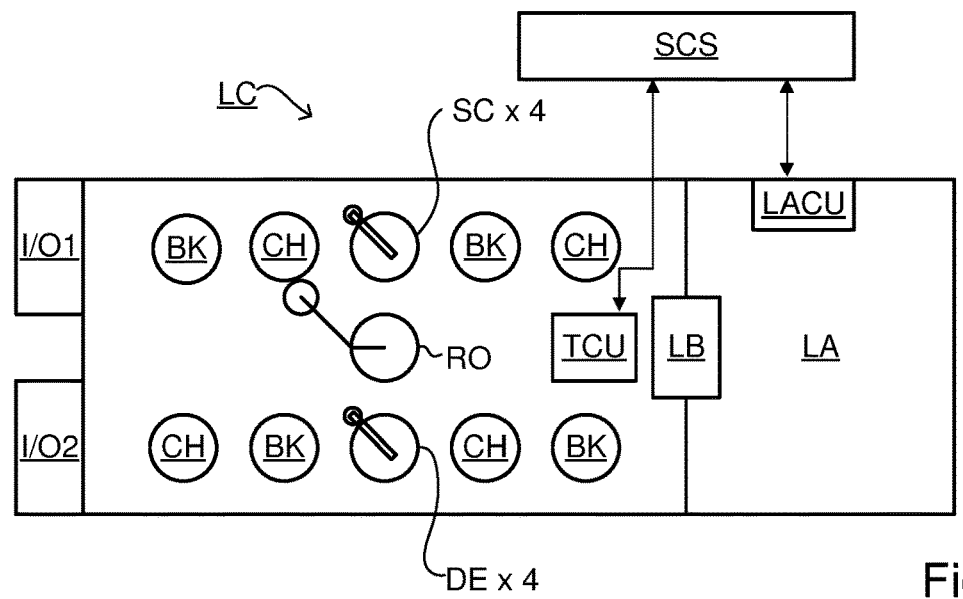
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In lithographic processes, it is desirable to make frequently measurements of the structures created, e.g., for process control and verification. Tools to make such measurement are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in an image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from soft x-ray, extreme ultraviolet and visible to near-IR wavelength range.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools and/or metrology tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is an ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922, 587, 13/000,229, 13/033,135, 13/533,110 and 13/891,410 incorporated herein by reference in their entirety.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. Typically the pitch and line-width of the structures in the gratings strongly depend on the measurement optics (in particular the NA of the optics) to be able to capture diffraction orders coming from the metrology targets. As indicated earlier, the diffracted signal may be used to determine shifts between two layers (also referred to as 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resemble the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1 incorporated herein by reference in its entirety.

Figure 3:
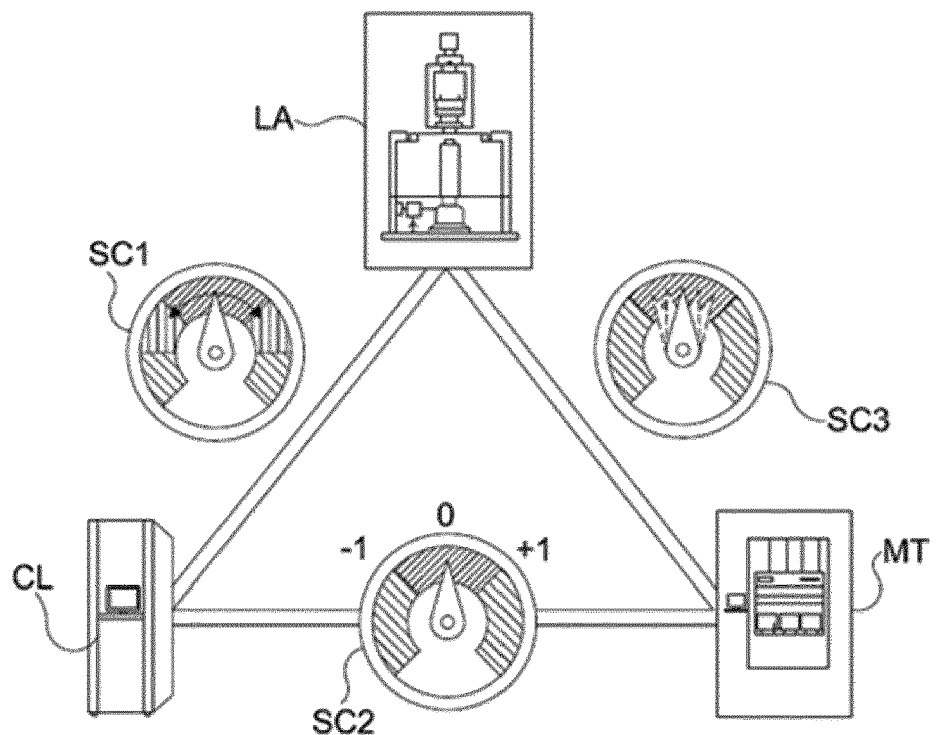
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MET (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second scale SC2).

The metrology tool MET may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Various tools for making such measurements are known, including scanning electron microscopes or various forms of metrology apparatuses, such as scatterometers. Examples of known scatterometers often rely on provision of dedicated metrology targets, such as underfilled targets (a target, in the form of a simple grating or overlapping gratings in different layers, that is large enough that a measurement beam generates a spot that is smaller than the grating) or overfilled targets (whereby the illumination spot partially or completely contains the target). Further, the use of metrology tools, for example an angular resolved scatterometer illuminating an underfilled target, such as a grating, allows the use of so-called reconstruction methods where the properties of the grating can be calculated by simulating interaction of scattered radiation with a mathematical model of the target structure and comparing the simulation results with those of a measurement. Parameters of the model are adjusted until the simulated interaction produces a diffraction pattern similar to that observed from the real target.

Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers can measure in one image multiple targets from multiple gratings using light from soft x-ray, extreme ultraviolet and visible to near-IR wave range.

Figure 4:
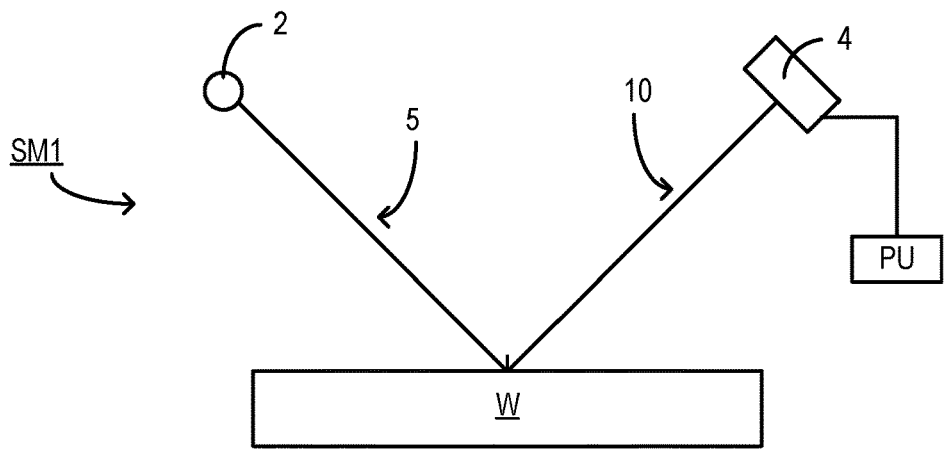
FIG. 4 schematically illustrates a scatterometry apparatus.
Figure 4:
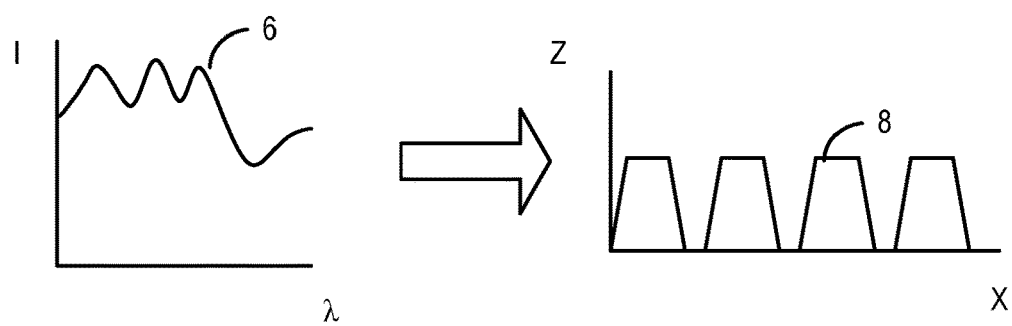

A metrology apparatus, such as a scatterometer, is depicted in FIG. 4. It comprises a broadband (e.g. white light) radiation projector 2 which projects radiation 5 onto a substrate W. The reflected or scattered radiation 10 is passed to a spectrometer detector 4, which measures a spectrum 6 (i.e. a measurement of intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 4. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 5A:
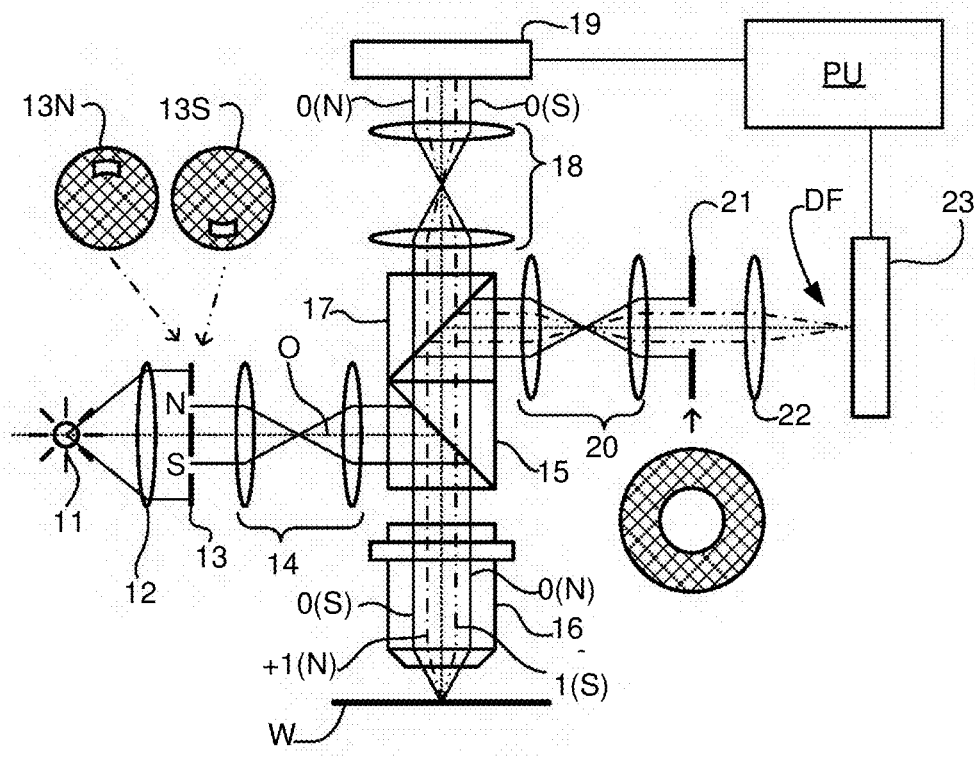
FIGS. 5A-5D comprise FIG. 5A a schematic diagram of a dark field scatterometer, FIG. 5B a detail of diffraction spectrum of a target structure, FIG. 5C a second pair of illumination apertures providing further illumination modes and FIG. 5D a third pair of illumination apertures.

FIG. 5(a) presents an embodiment of a metrology apparatus and, more specifically, a dark field scatterometer. A target T and diffracted rays of measurement radiation used to illuminate the target are illustrated in more detail in FIG. 5(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

Figures 5B, 5C, 5D:
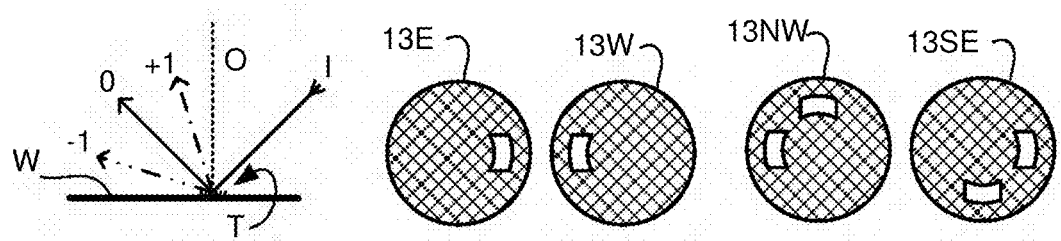

As shown in FIG. 5(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 5(a) and 5(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 5(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 5 are purely examples. In another embodiment, on-axis illumination of the targets is used and an aperture stop with an off-axis aperture is used to pass substantially only one first order of diffracted light to the sensor. In yet other embodiments, 2nd, 3rd and higher order beams (not shown in FIG. 5) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. Different aperture plates are shown in FIGS. 5(c) and (d). The use of these, and numerous other variations and applications of the apparatus are described in prior published applications, mentioned above.

The imaging optics of the metrology tool of the type shown in FIG. 5 are extremely complicated with low tolerances and high aberration requirements. To relax these requirements, Computational Imaging (CI) techniques have been described, such as in published patent application WO2019068459A1 or Patent application EP18158745.2 filed Feb. 27, 2018 which are incorporated herein by reference in its entirety. In CI, the high-quality and high-NA imaging optics of a typical metrology device are replaced by a simple single lens, for example, which creates a relatively distorted and/or aberrated image of the metrology target(s) on an image sensor. A near-perfect image of metrology targets can be retrieved when the full field (both intensity and phase) of the light on the sensor is known by direct phase resolved measurements (e.g. holographic microscopy) or by phase retrieval methods (phase is retrieved from intensity measurements only) or by hybrid combinations of thereof. In phase resolved measurements, the full electric field on the sensor can be observed by using a holographic setup and applied knowledge regarding the imaging system. Phase retrieval methods may use a phase retrieval algorithm and prior knowledge relating to the imaging system and/or the metrology targets. Examples of suitable phase retrieval methods have been described in the aforementioned published patent application WO2019068459A1.

A metrology tool of the type shown in FIG. 5 may use partially spatially coherent (or even incoherent) illumination. In a Computational Imaging (CI) based sensor such as described above, it is proposed that (at least nearly) fully spatially coherent illumination may be used. However, spatially coherent radiation has the drawback of increased crosstalk between non-target structures, e.g. product structures, and the target being measured. This increased crosstalk results in a reduced process variation robustness, in the absence of any mitigation strategies.

To appreciate this crosstalk issue, it should be appreciated that fully spatially coherent illumination results in a larger effective point spread function (i.e., the point spread function is larger and decays less rapidly and additionally, all fields are added in amplitude but less so in intensity). This increases the crosstalk from neighboring customer structures to the targets (e.g., overlay, focus or critical dimension CD targets).

To address this crosstalk issue, it is proposed to perform a measurement using a spatially coherent illumination scheme. In this context "spatially coherent" means either fully or near fully spatially coherent, where near fully spatially coherent describes a level of coherence sufficient to reduce the crosstalk between targets, target sections, or from neighboring structures to the target (sections). The resultant image (a first image) from this spatially coherent measurement is then convolved with a suitable Fourier transform to obtain a reimaged image which is equivalent to that which would have been obtained using an alternative, desired illumination scheme. The desired illumination scheme might be, for example an illumination scheme presently used on a tool such as illustrated in FIG. 5 (e.g., partially spatially coherent radiation) or spatially incoherent radiation, for example. The suitable Fourier transform comprises the Fourier transform of the mutual intensity function describing the alternative (desired) illumination scheme.

As such, it will be described how to re-image a partial coherent intensity image as a convolution between the intensity image formed by a single plane wave illumination (spatially coherent first image) and the Fourier transform of the incident mutual intensity function of a desired illumination scheme. For such a convolution to be valid, the measurement should be performed in the paraxial regime, or else the measurement should first be computationally propagated from a non-paraxial to a paraxial regime (for example by computationally introducing a suitable magnification in this propagation).

Figure 6:
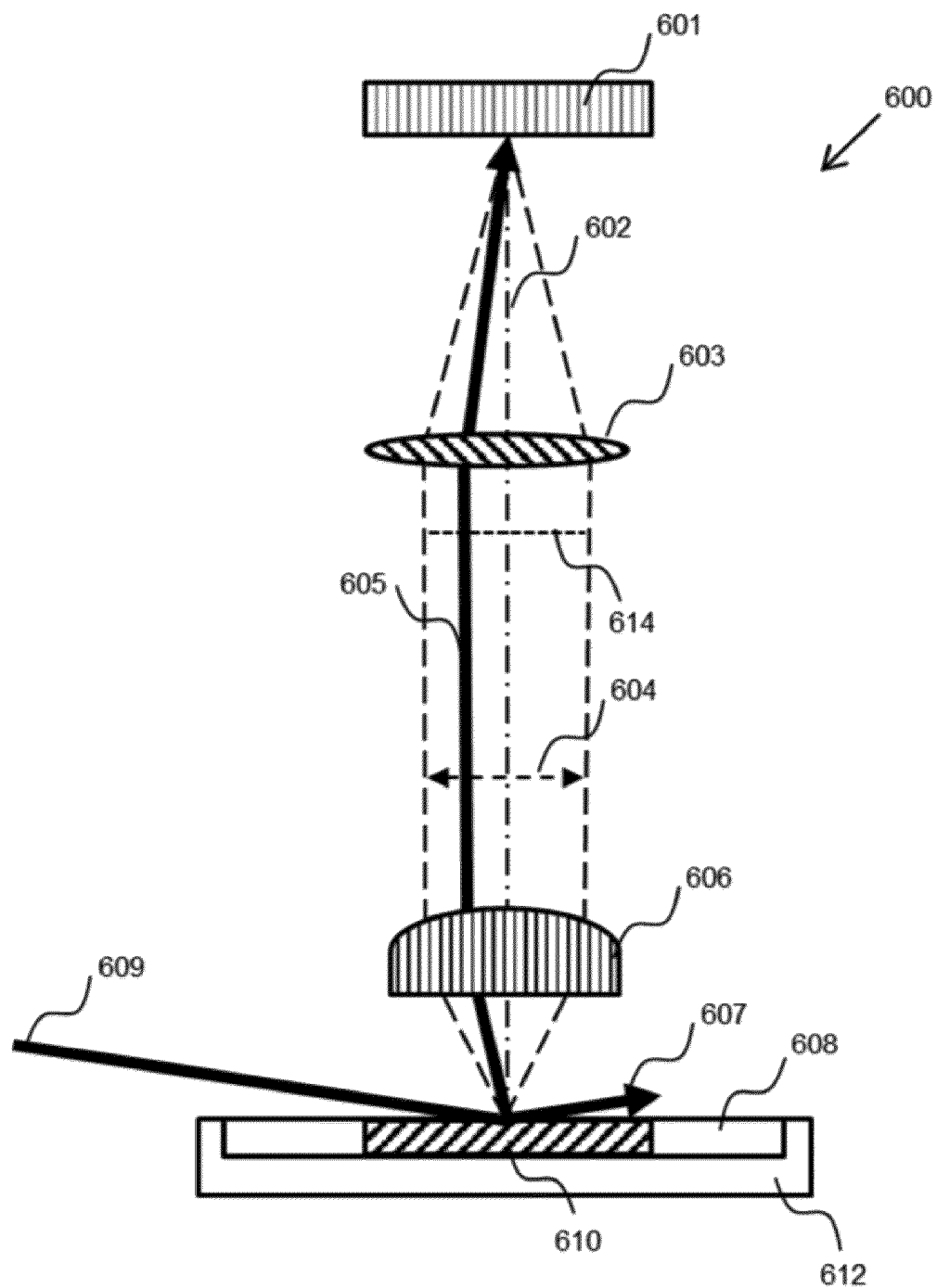
FIG. 6 shows simplified schematic representations of a metrology tool.

FIG. 6 shows simplified schematic representations of a metrology tool 600. One or more of the features of the metrology tool described with respect to FIG. 4 or 5 may also be present in the metrology tool 600 as appropriate. It is proposed, in an embodiment, that such an arrangement be used in combination with a computational imaging based sensor as described above. However, this is not essential, as will be described.

The metrology tool 600 comprises a sensor 601 or called a detector and sometimes referred to with the term camera. In one embodiment, the sensor 601 is an optical sensor, or called an optical detector. Optionally, the sensor 601 is at the image plane of a detection optical system with an imaging optics, and it is called as an image plane sensor or detector. The sensor 601 is positioned in a detection optical system, which may also comprise a lens 606 and optionally also a focus lens 603. In exemplary arrangements, the sensor 601 may be a CMOS camera. The detector 601 may detect a radiation information or called a radiation signal 605. In some of the embodiments, the radiation information 605 is used to indicate diffraction components.

An incident radiation 609 is from one direction onto an area 608 of a substrate 612 comprising at least a portion of a target structure 610. The area 608 may be called illumination area in this application. In an embodiment, the radiation information 605 is the information of a radiation scattered or diffracted by the target structure 610, representing a portion of radiation scattered by the area. In an embodiment, the radiation information 605 is collected through the lens 606 and optionally is focused by the focus lens 603 onto the sensor 601.

In an embodiment, the diffraction components which maybe the radiation information 605 comprises one or more non-zeroth order diffraction components, for example a first order diffraction component only or one or more of a first, second, third or higher order non-zeroth order diffraction component, scattered from the target structure 610.

The incident radiation 609 may be fully spatially coherent or partially spatially coherent. Optionally the incident radiation 609 is a highly collimated spatially coherent light beam. A line 602 is shown in FIG. 6 to indicate the center line of the imaging optics which comprise lenses 603 and 606.

The lens 603 may be a focus lens to focus the radiation information 605 into the detector 601. A reflected radiation 607 is obtained by reflecting the incident radiation 609 on the illumination area 608.

The incident radiation 609 is diffracted by the target 610 into one or more non-zeroth order diffraction components which may be the radiation information 605. Optionally the radiation information 605 may be a first diffraction order. The radiation information 605 may be collected by the lens 606. The system may be physically limited in a numerical aperture (NA) 604 of the imaging optics, which may determine which diffraction orders from the target structure 610 are collected by the imaging optics.

A pupil plane 614 may be at any position between the lens 606 and the focus lens 603 and is perpendicular to the center line of the imaging optics.

Figure 7:
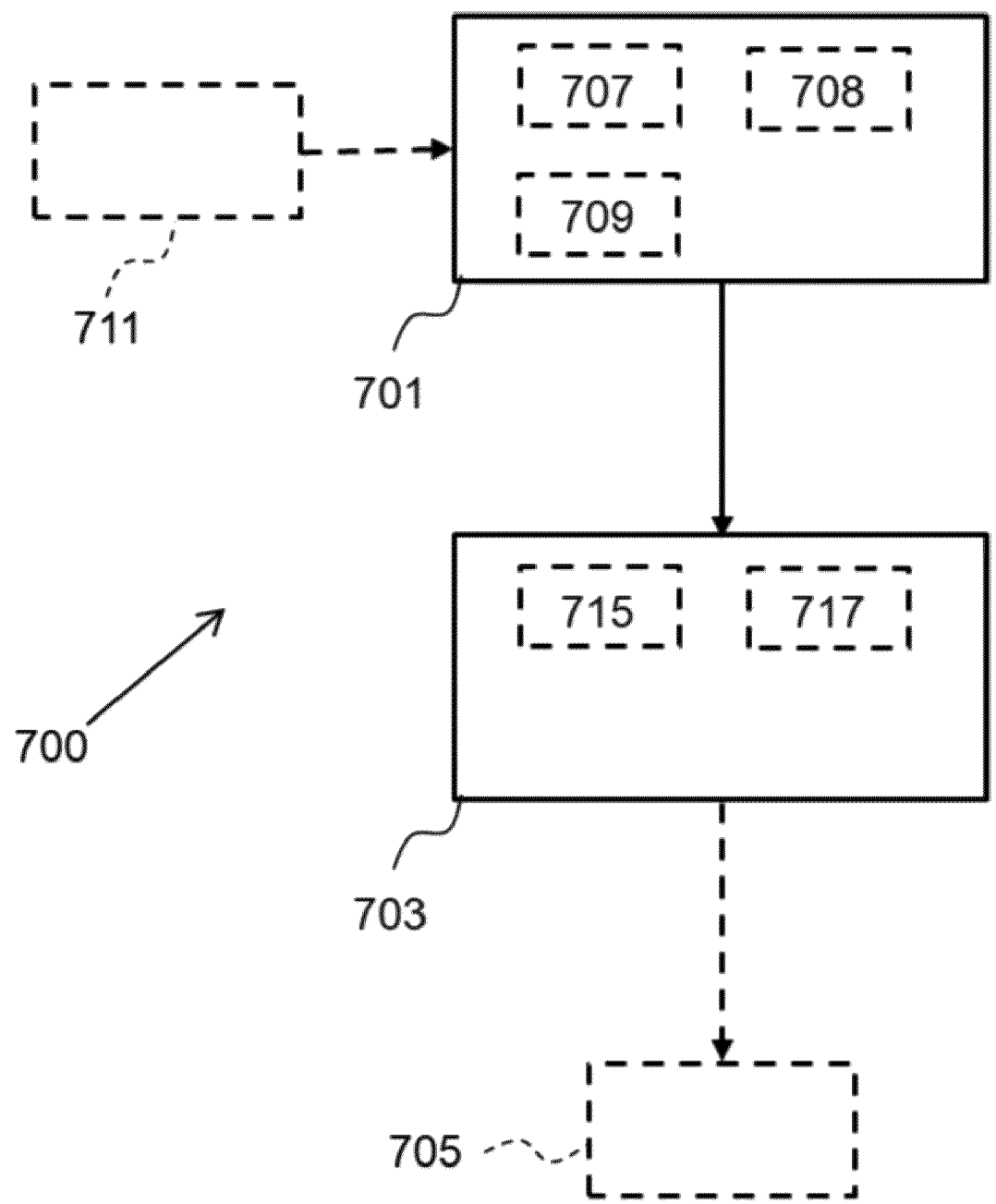
FIG. 7 shows a flow diagram for a method for a metrology measurement.

FIG. 7 shows a flow diagram for a method for a metrology measurement 700. The method 700 may be fully or partially performed in the above discussed metrology tools, for example, the metrology tool 600 of FIG. 6 or the metrology apparatus that is discussed in the context of FIG. 5(a). The method 700 may comprise a first step 701 and a second step 703. In the first step 701 the radiation information 605 is received. The radiation information 605 may represent a portion of radiation scattered by the illumination area 608 of the substrate 612. The method may also comprise the step 711 of providing an incident radiation, emitted by a radiation source, on the area 608. The step of receiving radiation information 701 may comprise a first further step 707 of detecting the radiation information 605 with a detector 601 and/or a second further step 708 of obtaining a complex electric field from the received radiation information by a phase retrieval method. In an embodiment, the step of receiving radiation information 701 comprise a third further step 709 obtaining a phase signal comprising the target structure 610 information, optionally via a data transmission.

The second step 703, also called the filtering step, may be using a filter in a Fourier domain for removing or suppressing at least a portion of the received radiation information 605 that does not relate to radiation that has been scattered by the target structure 610 for obtaining a filtered radiation information for the metrology measurement. The major of or all of the removed or suppressed is at least a portion of the received diffraction components which may be the radiation information 605 that is not scattered by the target structure 610. The goal is to keep a large part or all of the information from the target structure 610 while removing a part or all of the information that relates to a portion of the area 608 that is not the target structure 610. The crosstalk between radiations scattered by structures outside the target structure 610, such as, for example product structures, and scattered by the target structure 610 is therefore reduced. The result of the filtering step 703 may be obtaining a filtered radiation information that may be used for the metrology measurement. The filtering step 703 may comprise a further Fourier-transforming step 715 of Fourier transforming a complex field obtained in the step of receiving radiation information 701. The filtering step 703 may comprise a further pupil imaging step 717 of obtaining a pupil image of the received radiation information 605 in the Fourier domain.

The method 700 may further comprise a third step 705 of subsequently performing an inverse Fourier transform using the filtered radiation information obtained in the step 703 to recompute a filtered image.

The phase retrieval method used in the first step 701 may be a direct phase retrieval measurement or an indirect phase retrieval measurement. The direct phase retrieval measurement may be Holography or lateral shearing interferometry. The indirect phase retrieval measurement may be using a phase retrieval algorithm. For using phase retrieval algorithm, a diversity is needed, which may be a varying wavelength, focus, or numerical aperture (NA). Optionally, the phase retrieval algorithm is a ptychography algorithm. Optionally, the phase retrieval algorithm is a Gerchberg-Saxton algorithm.

Figure 8A:
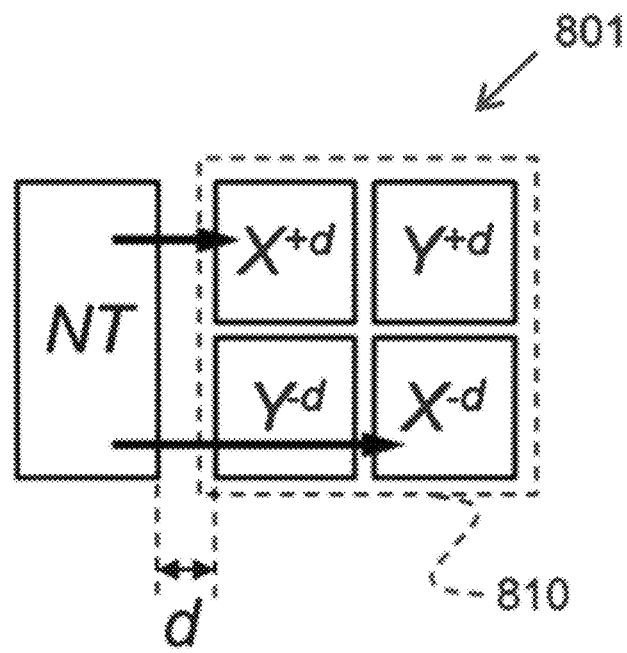
FIGS. 8A-8B show FIG. 8A a crosstalk example in a schematic representation, and a metrology target structure.
Figure 8B:
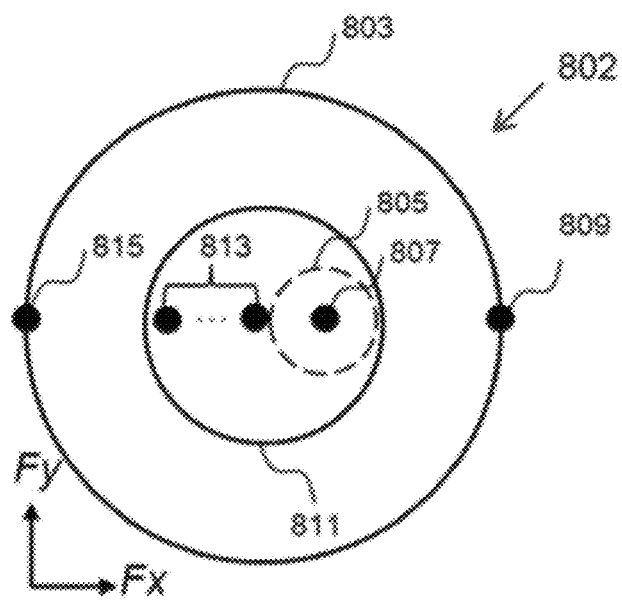

FIG. 8 (a) shows a crosstalk example 801 in a schematic representation of one example of crosstalk between a non-target structure NT on the left, with a structure size, and a metrology target structure on the right. FIG. 8 (b) shows a pupil image embodiment 802 showing a filtering scheme in the Fourier domain to suppress the above-mentioned crosstalk.

In the crosstalk example 801 shown in FIG. 8 (a), the non-target structure NT, which does not belong to an overlay target structure embodiment 810, which shows one example of the target structure 610, is at least partly within the illumination area 608 of FIG. 6. In one embodiment, the non-target structure NT is a product structure, other target structures or any other structures existing on the substrate 612. At least the non-target structure NT is a structure or are structures for which no metrology value must be measured in a metrology measurement that uses the method 700. Optionally, the non-target structure NT may be a periodic structure with a pitch. Optionally, the non-target structure NT may comprise multi pitches. There may be a separation of distance d between the non-target structure NT and the overlay target structure 810. Optionally, the distance d is more than 1 μm. Optionally, the distance d is within 1 to 10 μm. Note that the overlay target structure 810 shown in FIG. 8 (a) is only an example and the actual target structure may have a different design. In the crosstalk example 801 as shown in FIG. 8 (a) and discussed above, certain positions of the overlay target structure 810 and of the at least one non-target structure NT are suggested. The positions within the illumination area 608 are just examples.

The purpose of applying a metrology measurement to the target structure 610 is to determine a characteristic of the target structure 610, wherein optionally the characteristic of the target structure 610 is one of overlay, critical dimension and focus of the lithography apparatus while the lithography apparatus printed the target structure 610. In the example shown in FIG. 8 (a), one example of the target structure 610, the overlay target structure 810, is to determine the overlay and is composed by four structures $X^{+d}$, $Y^{+d}$, $X^{-d}$, and $Y^{-d}$ in plane of the substrate 612. Optionally the overlay target structure 810 may comprise two layers in two different layers of the substrate 612 and on top of each other. X and Y are symbolic representations of two perpendicular directions, + and − represent two opposite directions, and d is a bias shift between the two layers in + or − direction in the plane of the substrate 612. The overlay target may be used to measure the drifts between the two layers in both X and Y directions which refer to the corresponding overlay values of the two layers in X and Y directions respectively. The measurement is as described above, and they are not described again here in detail. Optionally the four structures $X^{+d}$, $Y^{+d}$, $X^{-d}$, and $Y^{-d}$ are periodic structures, optionally gratings, with the same pitch, target structure pitch P. The non-target structure NT in the area 608 may not have the same pitch of the overlay target structure 810, and there may be a separation in the Fourier domain between a first portion of the received radiation information that is scattered by the overlay target structure 810 and a second portion of the received radiation information that is not scattered by the overlay target structure 810. In the crosstalk example 801 shown in FIG. 8 (*a*), the grating of the non-target structure NT has the same direction as the grating of the structures in X direction, $X^{+d}$ and $X^{-d}$, of the overlay target structure 810. The crosstalk is severe in X direction for this embodiment.

It has been recognized that crosstalk, optionally optical crosstalk, between the non-target structure NT and the overlay target structure 810 is a concern as the crosstalk may perturb the overlay measurement. In a fully spatially coherent imaging system this type of crosstalk may be quite severe because of wider point spread function and this type of crosstalk may be especially dangerous for overlay signal extraction. The crosstalk may become severer when the distance d becomes smaller and/or with the non-target structure pitch closer to target structure pitch P. The inventors have realized that the embodiments to be discussed are capable of lowering the impact of non-target structure NT on the received radiation information obtained from the metrology target structure 610 via suppression of the information that originates from the non-target structure NT to reduce the crosstalk.

In this embodiment, the complex electric field diffracted by the non-target structure NT will interfere with that diffracted by the target structure 610 and introduce spatial perturbations in the image of the target image. This is called crosstalk, or product optical crosstalk. These perturbations may introduce errors in the metrology measurement. The magnitude of this error may depend on the proximity of the non-target structure NT to the target structure 610, more specifically the proximity of a sharp discontinuity (e.g. the edge of the non-target structure NT) and the similarity of pitch between the non-target structure NT and the target structure 610.

In the pupil image embodiment 802 shown in FIG. 8 (*b*), which is in the pupil plane 614 as shown in FIG. 6, the incident radiation 609 and the reflected radiation 607 are corresponding to an incident radiation spot 815 and a reflected radiation spot 809 respectively in the pupil plane. The area in pupil plane based on the incident radiation spot 815 and the reflected radiation spot 809 is corresponding to an illumination region 803. An NA region 811 may be defined by the NA 604 of the imaging optics of a detection sub system of a metrology tool/apparatus, which may determine which diffraction orders from the overlay target structure 810 are collected by the imaging optics. The radiation information 605 that propagates to the sensor 601 may comprise radiation that is within the NA region 811. In this embodiment, the illumination region 803 is larger than the NA region 811, which is just an example, while in practice the sizes of these two regions in the pupil plane are based on the exact design. Optionally, the illumination region 803 is equal to or smaller than the NA region 811. The two axis and indicated normalized angular frequencies Fx, Fy in two perpendicular directions in the pupil plane.

A target spot 807 indicates a portion of the received radiation information that relates to radiation that has been scattered by the target structure 610, while a at least one non-target spot 813 indicates a portion of the received radiation information that does not relate to radiation that has been scattered by the target structure. The radiation scattered from the overlay target structure 810 may form the target spot 807 while the radiation scattered from the non-target structure NT may form the at least one non-target spot 813, optionally a product spot, or may form multiple non-target spots 813, optionally multiple product spots, in the pupil plane. For a fixed incident radiation wavelength and fixed incident radiation direction, the position of a spot on the pupil plane, which is the central frequency, or called pupil coordinate, of spot in the Fourier domain is determined by the pitch of the corresponding structure as shown by the non-target spot 813.

An example of the filter 805 in Fourier domain is used for removing or suppressing a portion of the received radiation information that falls outside of the shown circular area, the major of which is not scattered by the target structure 610, for obtaining a filtered radiation information for the metrology measurement. Optionally the filter 805 is an amplitude filter. Optionally the filter 805 is an algorithm in software domain. Optionally the filter 805 is a hardware filter. The characteristics of the filter 805 may be based on target information about the target structure 610, optionally comprising at least one of a central frequency of the filter $NA_{x,y}$ and a width of the filter $NA_w$ in the Fourier domain Optionally, the target information comprises at least one of a target structure size A and a slope of phase gradient $k_x$. Optionally, the target information comprises a pitch of the target structure. The above will be discussed in detail in the following descriptions.

In one embodiment, as shown in FIG. 7, the step of receiving radiation information 701 comprise a third further step 709 obtaining the target information from the phase signal comprising the target structure size A and the slope of phase gradient $k_x$, optionally via a data transmission.

In the pupil image embodiment 802 as shown in FIG. 8 (*b*) and discussed above, a certain position of the target spot 807 and of the at least one non-target spot 813 is suggested. The location within the NA region 811 are just examples. Depending on the pitch of the target structure 610 and the pitch of the non-target structure NT, for example, the target spot 807 may be located at the left side of the NA region 811 and the at least one non-target spot 813 may be located at the right side. In another example, the non-target structure NT has different pitches and a few non-target spots 813 may be located at the left side of the NA region 811 and a few of them may be located at the right side of the NA region 811 and the target spot may be located in a center portion of the NA region 811. In the example, the target spot 807 and the non-target spots 813 are drawn as circular, relatively small, dots. In practical examples, the spots 807, 813 may have different shape and/or may be larger in size. This depends on the exact shape of the structures on the substrate.

The following steps are an example of a method, which may be applied to remove or suppress the impact of the crosstalk mentioned: 1) a phase signal is obtained, optionally via a data transmission, or a phase retrieval is done on the image(s) received by the detector 601, a technique used in computational imaging, to obtain the complex field. 2) by Fourier transforming the complex field, one obtains access to the Fourier domain (pupil) in which filtering is possible optionally via region of interest (ROI) selection in the pupil plane. 3) by using a filter, optionally a software filter or a hardware filter, either in binary or in apodized fashion, the crosstalk from the non-target structure NT may at least partially be removed or suppressed, optionally providing that ratio of the signal intensity from the non-target structure NT to the signal intensity from the target structure 610 is lowered by the filtering action. And optionally, 4) an inverse Fourier transform recomputes the image(s).

FIG. 9 is one embodiment of the complex electric field of at least one diffraction order at the detector or camera level showing (a) an image 910 showing intensity of the complex electric field, representing amplitude, (b) an image 920 showing a phase of the complex electric field, and (c) a chart 930 showing a phase gradient to an equivalent NA location, which is corresponding to the dashed line in (b). The coordinate axis shows X and Y directions for FIGS. 9 (a) and (b). In FIG. 9 (c) the x-axis represents relative position in the illumination area on the wafer, Pos, and the y-axis represents phase values, Pha. FIG. 9 may also be considered as one embodiment of the schematic drawing in FIG. 8 (a).

In FIG. 9 (a), three white structures 911, 912, 913 in the intensity image with a black background are a non-target structure 911, which may be a product structure, a first metrology target $X^{+d}$ 912 and a second metrology target $X^{-d}$ 913. The non-target structure 911 may have periodicity in X direction, which is the same direction of the metrology target $X^{+d}$ and $X^{-d}$, as shown in FIG. 8 (a). When the characteristic in X direction of the metrology target is measured, the crosstalk between the two X-direction structures $X^{+d}$ and $X^{-d}$ may be severe. In FIG. 9 (b), three structures 921, 922, 923 surrounded by a striped background. The structures 921, 922, 923 correspond, respectively, to the structures 911, 912, 913 of the intensity image of in FIG. 9 (a).

The line in FIG. 9 (c) is phase showing phase gradient of the target structure $X^{+d}$ 922 along X direction. The phase values are shown as Y axis, Pha, of the radiation information from one of the metrology target structure $X^{+d}$ 922, which is chosen as an example, according to relative position in the illumination area on the wafer, shown as X axis, Pos.

A slope of a line 931 in between two dots 933 and 935, is phase slope $k_x$ of the target structure $X^{+d}$ along X direction. When the target structure $X^{+d}$ has a constant pitch, the phase slop $k_x$ is a constant value for all grating lines within the target structure $X^{+d}$. The phase gradient may be mapped to a specific NA location $NA_x$ which is the central frequency of the filter 805, which may also be the central frequency of the target spot 807 of the target structure 610, in the Fourier domain based on the phase slope $k_x$ by computing $$NA_x = \frac{k_x}{2\pi/\lambda}$$

The above method works for both X and Y directions to calculate the NA location $NA_{x,y}$, of the filter 805, wherein $$NA_{x,y} = \frac{k_{x,y}}{2\pi/\lambda}$$

In one embodiment, the filter may be designed in the form of an amplitude filter in the pupil plane of a width $NA_w$, positioned at $NA_{x,y}$. Both the width $NA_w$ of the filter 805 and its shape have significant impact on the image quality and overlay sensitivity, as will be shown in later descriptions. The width $NA_w$ of the filter 805 may be inversely proportional to the target structure size A and is given by the expression:

$NA_w \propto \lambda/A$, or $NA_w = C^* \lambda/A$ where C is a constant which may be chosen such that the filter retains the bulk of the target spot 807, shown in FIG. 8), in the pupil plane while removing or suppressing other spots outside of the filter 805 e.g. the non-target spots 813.

The phase retrieved complex field, for example the images shown in FIGS. 9 (a) and (b), of the overlay target structure 810, provides at least part of the characteristics of the filter 805 required for removing or suppressing a portion of the received radiation information that is not scattered by the target structure 610 for obtaining a filtered radiation information for the metrology measurement. Optionally, for the proposed method of using a filter in a Fourier domain, the pitch of the non-target structure is sufficiently distinct from the target pitch. This condition is met in many practical cases, wherein the target pitches may be of the order of 100 nm, whereas non-target structures, optionally product structures, are at least an order of magnitude smaller Optionally, in the pupil plane, the separation between the central frequency of the target spot 807 and the central frequency of the non-target spot, optionally the product spot 813, is larger than 0.2 NA to have an efficient filtering. Note that under this condition the solution is especially attractive for non-target structures located very close to the metrology targets, since the solution may operate in pupil space where the non-target and target signals may be easily separated based on the phase-retrieved complex field as shown above. This solution may not be affected by uncalibrated aberrations in the pupil plane, because that although the aberrations cause displacement or distortion effects in field plane, which is the plane of the image or detector and the Fourier transform pair of the pupil plane, the linear phase gradient of the complex field is tied to the location of the target spot in the pupil plane, which is dictated by its λ/p value. It may be more difficult to filter a non-target structure with a very similar, or even the same, pitch as that of the target using this method, and hence its crosstalk impact will be large.

Figure 10:
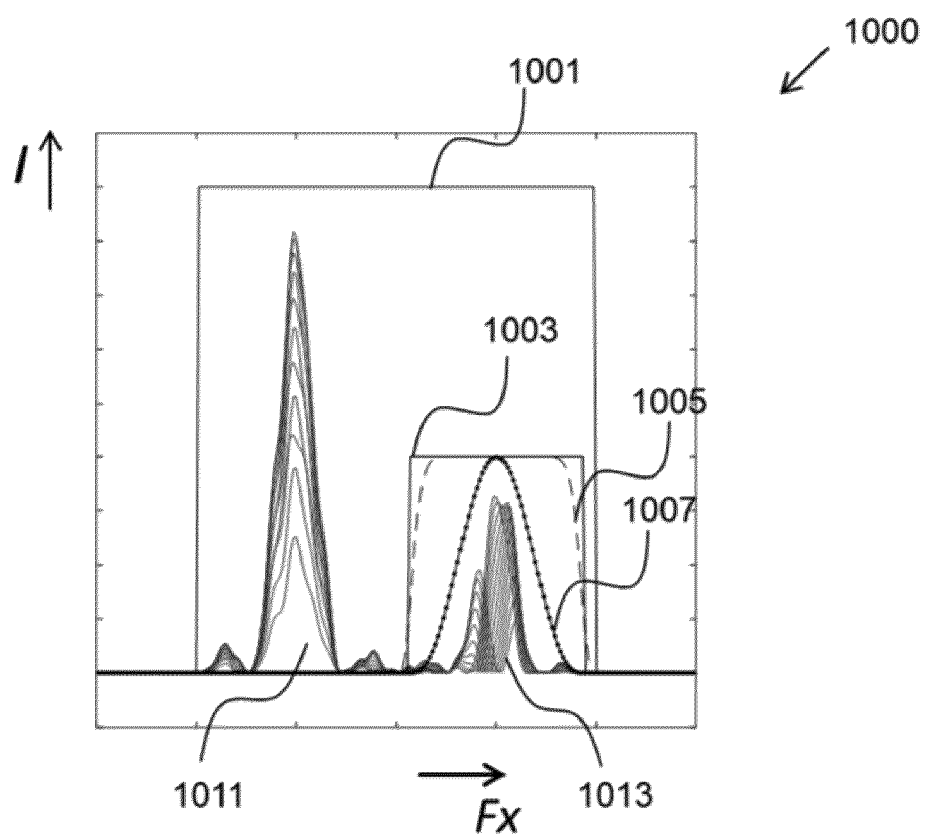
FIG. 10 shown in chart intensity cross-sections of a target spot and a non-target spot on the pupil plane.

FIG. 10 shown in chart 1000 intensity cross-sections of a target spot 1013 and a non-target spot 1011 on the pupil plane. The target spot 1013 may be formed by the radiation scattered from the target structure 610, and the non-target spot 1011 may be formed by the radiation scattered from the non-target structure NT. X axis indicates normalized angular frequencies Fx in the one direction of the pupil plane, or called pupil coordinates, which is also in the schematic image of FIG. 8 (b), while Y axis indicates relative intensities I. The different lines of the target spot 1013 and the non-target spot 1011 represent different intensity cross-sections along a direction which is in the pupil plane and is perpendicular to the X axis direction, as shown as the direction of Fy in FIG. 8 (b). A rectangle 1001 shows a system hardware aperture which is shown as the NA region 811 in FIG. 8 (b), The three filters indicated are called rectangular filter 1003, super-Gaussian filter 1005 and Sonine filter 1007 respectively based on their different cross-section shapes or called transmission function.

A simulation shown in FIG. 10 comprises a pair of X target structures laid diagonally in a typical overlay target as shown as $X^{+d}$ and $X^{-d}$ in FIG. 8 (a). The pair of X target structures have the same overlay bias value and the opposite bias directions along the grating direction, which is X direction in this embodiment. The non-target structure may be located adjacent to and optionally 1 μm away from the overlay target on the left side which is also simulated as a X grating with a fixed pitch. The target has an additional overlay due to the processing steps performed on the substrates W, which may also exist in the non-target structure. In the simulated embodiment, the metrology target has a pitch of 770 nm, while the non-target structure has a pitch varying, which will be discussed later. These values are chosen so that the non-target signal sweeps across the pupil, while the target signal is localized. The wafer is illuminated with the incident radiation with a wavelength λ=570 nm. In this example we analysed the impacts of three different shapes of the filter, while in practice the filter may be of any shape based on how well the crosstalk impact may be removed or suppressed. The cross-section shapes, or called the transmission function, of the rectangular filter 1003, super-Gaussian filter 1005 and Sonine filter 1007 may be described by the following equations respectively:

$$R(r) = rect\left(\frac{r - r_0}{r_w}\right)$$

$$SG(r) = \exp\left(-2\left(\frac{r - r_0}{r_w}\right)^p\right)$$

$$SO(r) = \left(1 - \left(\frac{r - r_0}{r_w}\right)^2\right)^\beta$$

wherein r is the radial coordinate which is linked to NA via r=NA·f, where f is focal length of the lens 606 shown in FIG. 6. Accordingly $r_0=NA_{x,y}\cdot f$ is pupil coordinate corresponding to the central frequency of the filter $NA_{x,y}$, and $r_w=NA_w\cdot f$ corresponding to the width of the filter $NA_w$ in the Fourier domain. The parameters p and β are shape parameters which control the roll-off of the filter. Optionally, the transmission function of the filter is such that it is flat in middle and softly roll-off at its edges. In our simulation the central frequency of the filter $NA_{x,y}$=0.2 NA and the width of the filter $NA_w$ is ±0.175 NA.

Figure 11:
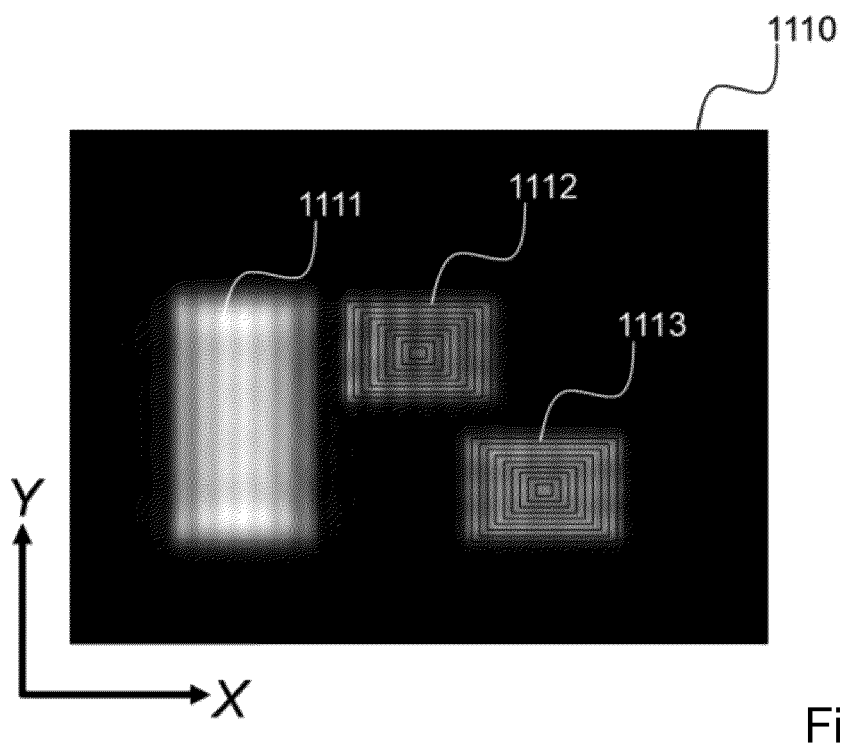
FIG. 11 shows one embodiment of an image at the image plane, with region of interest (ROI) selections.
Figure 12A:
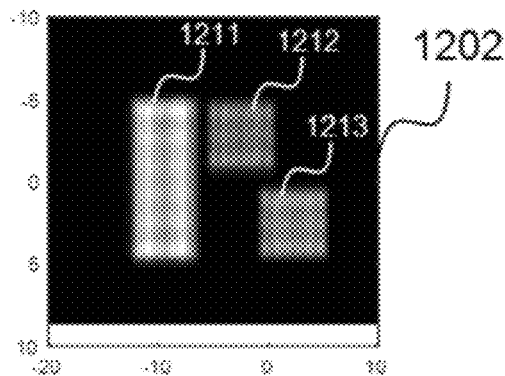
Figure 12D:
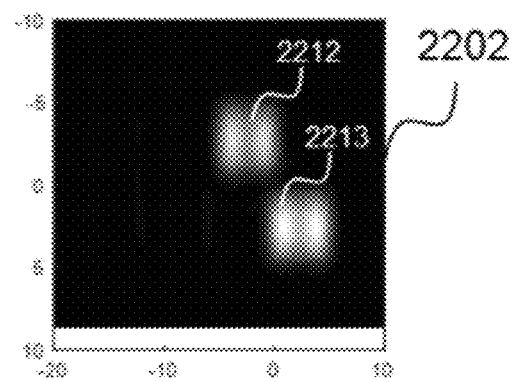
Figure 12B:
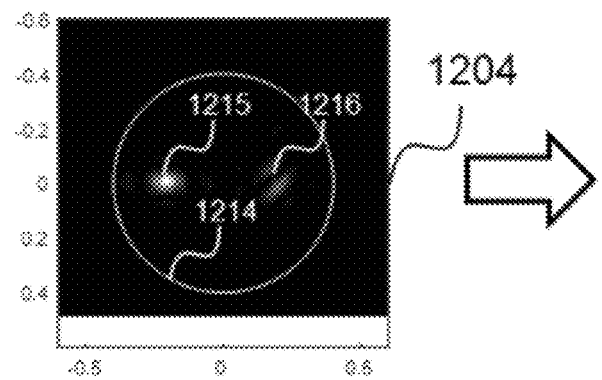
Figure 12E:
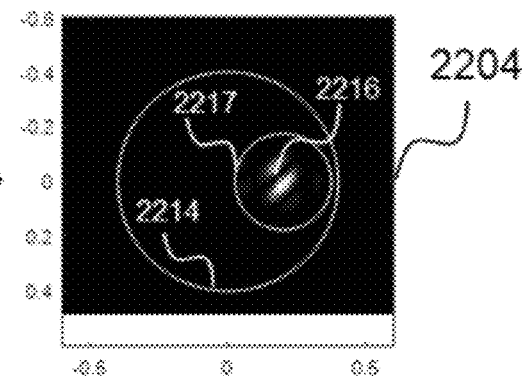
Figure 12C:
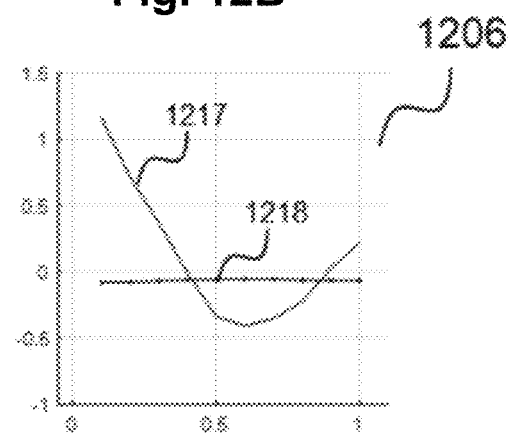
Figure 12F:
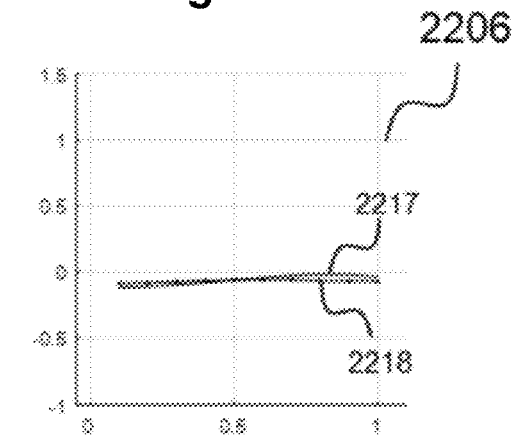

FIG. 11 is one embodiment of an image 1100 of at least one diffraction order at the image plane showing intensity of the complex electric field, and a similar image has been shown in FIG. 9 (a). Three structures 1111, 1112, 1113 in the intensity image with a black background are non-target structure 1111, a first metrology target $X^{-d}$ 1112 and a second metrology target $X^{-d}$ 1113. The rectangles dawn in the structures 1112 and 1113 are region of interest (ROI) selections of a metrology target for varying crop ratio. The crop ratio is the relative size of an ROI box, shown as rectangular box in both X structures 1112 and 1113, compared to the metrology target structure size, or the size of the measured X target structure, optionally the size of $X^{+d}$ 1112 or $X^{-d}$ 1113. When the crop ratio is equal to one, it means that the ROI box is same size as measured target structure size. FIG. 11 illustrates examples of the ROI which may be used for computation of mean intensities on the target structures, optionally the crop ratio increases from 0.1 to 1.

A rectangular ROI is chosen to conform to the structure definition because simulations are done assuming aberration free sensor, and thus the images are not distorted or aberrated. The effect of filter on visual image quality is to blur the structure edges (due to loss of resolution) and suppress ringing features, which is called mathematically the Gibbs phenomenon. Thus size of ROI box is a good parameter to evaluate this method because it highlights the sensitivity of mean intensity to local ringing (small ROI) as well as to edge blur (large ROI).

FIG. 12 shows simulated result of one embodiment to compare effects with and without a filter. In the left column of FIG. 12, including an intensity image (a), a pupil image (b), and an overlay sensitivity plot (c), an example of simulations before filtering is shown. In the embodiment, a filter is used, indicated as 2217 in FIG. 12 (e), and the simulation after filtering is shown in the right column of FIG. 12, including an intensity image (d), a pupil image (e), and an overlay sensitivity plot (f). The filtering is in the pupil plane, or in the Fourier domain, to supress or remove the information outside of the circle and keep the information inside of the circle.

FIGS. 12 (b) and (e) are pupil images 1204 and 2204 showing the pupil images in the Fourier domain before and after filtering respectively. The filtering is to suppress the above-mentioned crosstalk, as illustrated in FIG. 8 (b). Target spot 1216 and 2216 may be formed by the radiation scattered from a metrology target structure as illustrated as 807 in FIG. 8 (b). A non-target spot 1215, optionally a product spot, may be formed by the radiation scattered from the non-target structure NT. NA region 1214 in FIG. 12 (b) and 2214 in FIG. 12 (e) may be defined by the NA 604 of the simulated imaging optics of a detection system of a metrology tool/apparatus, as illustrated as 811 in FIG. 8 (b). Note that the pupil images are obtained by computing the Fourier transform of the detector images. Before filtering the non-target spot 1215 is present, while it is hardly invisible after filtering with a filter, which is illustrated as a circle 2217 in FIG. 12 (e). Optionally, the filter is a super-Gaussian filter, which may be flat in middle and softly roll-off at its edges.

The super-Gaussian filter, as mentioned above, may be designed to soften edges of the filter while leaving the central region flat, as shown in FIG. 10, which may help to suppress the ringing features in the image of the structures on the detector due to relative suppression of side-lobes of the effective point spread function associated with the filter.

FIGS. 12 (a) and (d) are intensity images 1202 and 2202 of the complex electric field at the image plane, similar as in FIG. 9 (a) and FIG. 11. The intensity images 1202 and 2202 corresponds to the pupil images 1204 and 2204 respectively. FIGS. 12 (a) and (d) may be images of the same incident radiation information, which may be the radiation of at least one diffraction order, with and without filtering respectively. In FIG. 12 (a) three white structures 1211, 1212, 1213 in the intensity image with a dark background may be a non-target structure 1211, optionally a product structure, a first metrology target $X^{+d}$ 1212 and a second metrology target $X^{-d}$ 1213. The distance d between the non-target structure and the target structure is 1 μm in this simulation example. For this embodiment, after filtering, the non-target structure is hardly visible in the intensity image, while the images of the two metrology targets 2212 and 2213, which are responding to 1212 and 1213 in FIG. 12 (a) respectively, are still visible, as shown in FIG. 12 (d). The filtering results in loss of resolution, which may be seen in the blurring of the edges in the detector images. But in practice it may not be a problem when the information that is used in the metrology tool is based on average intensity over a certain area, e.g. ROI.

FIGS. 12 (c) and (f) show overlay sensitivity plots 1206 and 2206, which is overlay errors as a function of the crop ratio with and without filtering corresponding to 1204 and 2204 respectively. X axis indicates crop ratio while Y axis indicates overlay error. In this example, the overlay error is defined as difference between set overlay value and the value obtained from the simulated metrology measurement, which may be calculated based on an intensity asymmetry on the target computed, on a given ROI. NA of 0.4 is used in this simulation example. A black curves around Y=0 line, 1218 or 2218, shows the overlay errors in absence of any neighbouring non-target structure optionally product structure, i.e. no crosstalk. It is seen that the overlay error curve is less sensitive to ROI with filtering as compared to when no filter is used. It can also be seen that the overlay error reduces after filtering and that the overlay error is about similar to what it would be without non-target structures optionally product structures, e.g. as line 2218.

In the above simulated embodiment, the metrology target has a pitch of 770 nm, while the neighbouring non-target structure has a pitch varying from 450 nm through 650 nm, in steps of 50 nm. Although only results from one specific non-target structure pitch is shown, which is that the non-target structure has a pitch of 500 nm, all the other non-target structure pitches have been simulated. The conclusions apply when the pitch of the non-target structure is sufficiently different from the target pitch. If the pitch of the non-target structure approaches target pitch, it may not be sufficiently removed by some of the filters and may still be present in the filtered detector image, and for these cases, the overlay sensitivity may increase with varying ROI, indicating poor crosstalk suppression.

With some filters, for example the rectangular filter 1003, the overlay error may be less sensitive to ROI as compared to when no filter is used, when the non-target structure pitch is sufficiently different from the target pitch, for example when the non-target structure pitch is 450 nm, 500 nm, or 550 nm. As the non-target structure pitch is not sufficiently different from the target pitch, for example when the non-target structure pitch is 600 nm or 650 nm, the signal from the non-target structure may not be sufficiently removed by the filter, which means at least a portion of the non-target signal falls inside of the filter and shows up in the detector.

With some filters, for example a filter with a transmission function which is flat in middle and softly roll-off at its edges, optionally the super-Gaussian filter 1005 or Sonine filter 1007, when the non-target structure pitch approaches target pitch, or when the non-target structure pitch is not sufficiently different from the target pitch, for example when the non-target structure pitch is 600 nm or 650 nm, the overlay sensitivity is less than when the rectangular filter 1003 is used. The closeness of the overlay error curves to what it would be without non-target structures optionally product structures, e.g. as line 2218, shows the effectiveness of crosstalk removal or repression.

Using a filter which is softly roll-off at its edges, optionally a super-Gaussian filter, may causes a slight increase in the main lobe of the point spread function, resulting in a small loss of resolution as compared to e.g. using the rectangular filter. The detector and pupil images may appear to be similar to those using rectangular filter, by design. The key difference is that the overlay error may appreciably be less sensitive to ROI when the pitch of the non-target structure is sufficiently different from the target pitch. Even as the pitch of the non-target structure approaches target pitch, the overlay error may be less than e.g. when a rectangular filter is used. The closeness of the overlay error curves to the black reference curve shows the effectiveness of crosstalk mitigation using super-Gaussian filter.

In the above-mentioned simulation, super-Gaussian filter is used for removing or suppressing at least a portion of the received radiation information that does not relate to radiation that has been scattered by the target structure, while in practice, other types of filters, optionally rectangular filter, and Sonine filter, may also be used. The characteristics of the filter are based on target information about the target structure. The characteristics of the filter may also be optimized and determined in advance via simulation.

Optimal choice of size and shape of filter may reduce impact of optics aberrations if that area outside NA region has on average a higher amount of optical aberration. As can be seen in FIG. 12 (*c*), the crosstalk induced overlay error may oscillate around zero as a function of crop ratio. Amplitude of the swings indicates the severity of the crosstalk. The size and shape of filter may have a significant impact on the swings. A smooth i.e. apodized filter may subdue the swings and suppresses the ringing features in images, thus helping to mitigate crosstalk induced overlay errors. These advantages may come at the expense of loss of resolution, i.e. resolution deterioration, due to a small aperture, which is the filter used. Due to the target layout the resolution deterioration may be handled and may not introduce additional measurement error.

Figure 13:
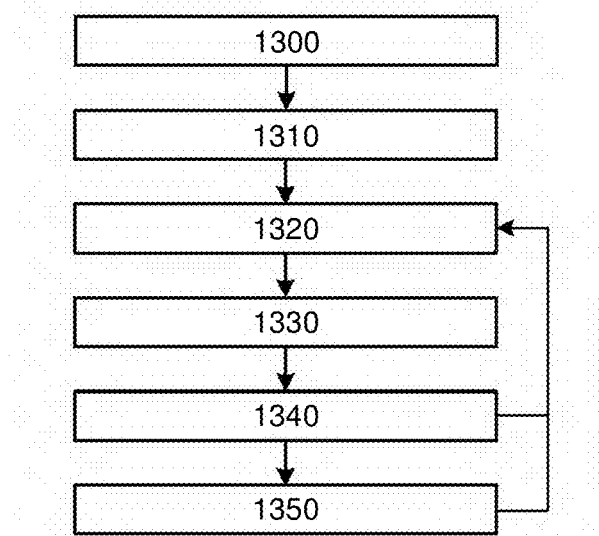
FIG. 13 is a flowchart describing a pupil region of interest optimization step according to an embodiment of the invention.

An embodiment will now be described which can be used to optimize selection of an ROI within the pupil or Fourier plane, i.e., such that the filtering is selectively applied (e.g., during the filtering step 703 of the method of FIG. 7) in a more optimal pupil region than the methods described previously. FIG. 13 is a flowchart describing such a method. At step 1300 a phase retrieved image is obtained comprising a complex electric field description, e.g., from received radiation information by a phase retrieval and/or holographic method as already described. Step 1310 comprises a Fourier-transforming step of Fourier transforming the complex field obtained in the step 1300 to obtain the corresponding pupil image.

As an alternative to steps 1300 and 1310, or in combination, pupil images for the optimization may be obtained via simulation, e.g., based on an analysis of ideal structures defined on the reticle. In such an embodiment, pupil response for these structures can be simulated for proper exposure/processing conditions. This pupil response can be predicted for the target and its surroundings. This analysis can be executed during setup of the layer and could be used as it is, or serve as a starting point for further fine-tuning of the pupil area selection on actual measurements (e.g., performing the simulation first, and steps 1300/1310 thereafter).

Step 1320 is a pupil optimization step is performed to optimize the ROI within the pupil (e.g., as obtained from step 1300/1310 or simulated). This may comprise a free selection method (trial-and-error based on e.g., observation). However such an elaborate approach may be very time-consuming. A more efficient optimization step approach may comprise identifying regions using a clustering algorithm, e.g. K-means, and only comparing permutations of such regions. At step 1330 the optimized pupil (e.g., having had information outside of the ROI filtered out), for this iteration is inverse Fourier transformed using the filtered radiation information to recompute an optimized filtered image for this iteration.

At step 1340, a first evaluation step may be performed to evaluate the optimized pupil for this iteration. The evaluation may be based on one or more suitable key performance indicators (KPIs) describing the stability of the ROI, e.g. signal strength and/or image contrast in frequency regimes with/without expected fringes. More specifically, an optimized pupil will comprise minimized or small fringes within the ROI and a high (e.g., maximized) contrast of the ROI with respect to the remainder of the target. A second evaluation step 1350 may evaluate intra-wafer variation of diffracted intensities in either the pupil or field plane. The diffracted intensities (as has already been discussed) may be perturbed by neighboring areas and features and different target-sites of otherwise similar targets are expected to have different surroundings. Thereby, minimal intra-wafer variation indicates a good ROI. Note that the evaluation within this method may comprise either one or both of evaluation steps 1340, 1350. The method then continues for another iteration till all candidate ROIs are evaluated and/or an optimized ROI is identified. The optimized ROI can then be used for measurements using the methods disclosed herein.

It should be appreciated that this optimization method comes at the cost of performing two Fourier transform steps to transform back and forth between field- and pupil-plane every iteration. As such, it may be desirable to limit the number of iterations per optimization (e.g., using a clustering algorithm as described) and/or the frequency of performing a full optimization. The pupil optimization can be performed, for example:

- At machine setup only (although this may be too coarse);
- At recipe setup only;
- At the start of every lot;
- At the start of every wafer;
- Triggered by an event; e.g., when an image KPI (e.g., such as a KPI already described) deviates above a trigger threshold. In this case, the optimization may be only performed on occasion of such an event, or this can be used in combination with a scheduled ROI optimization at one of the above frequencies.

Such an approach results in increased flexibility in applying pupil filter, improved robustness against cross-talk with product-structures. The method can be automated in recipe-setup or as a per-lot or per-wafer operation.

Up to now, the approaches described herein have described filtering out non-target related influence/perturbations from received complex-field information relating to a target measurement. Here an extension of the basic concept will be described which separates opposing diffraction orders, such that they may be measured simultaneously in phase retrieved (computational imaging) metrology. The method may be used separately or in combination with the filtering methods for filtering out external non-target influences described herein.

In conventional, non-computational, metrology, a known technique comprises obtaining separate images of opposing higher diffraction orders (e.g., the +1 and −1 orders) by using a "quad illumination aperture" comprising illumination in only two diagonally opposing quadrants, leaving the other two quadrants free for detection. Such an illumination aperture results in simultaneous measurement in "a normal illumination mode" and "a complementary illumination mode"; i.e., with illumination incident in opposite directions simultaneously. Optical wedges are provided in the pupil plane which guide the diffracted radiation and separate the orders such that part of one diffracted order is detected in one of the detection quadrants and part of the opposing diffracted order is detected in the other detection quadrant.

It is proposed to implement a similar concept digitally, based on the access to the reconstructed pupil obtained in the methods already described. The proposal comprises the steps of: illuminating from two opposite directions; e.g., in "a normal illumination mode" and "a complementary illumination mode", reconstructing the pupil and separating the normal and complementary information in the pupil plane, based on the pupil location. Such an approach only works if the diffraction orders that result from the normal and complementary illumination angles are separated in the pupil (if the diffraction orders cannot be separated in the pupil based on their position, a temporally sequential acquisition may be performed). This can be achieved by proper choice of illumination mode, comprising a limited range of angle of incidence and azimuthal angles. Such an illumination mode may comprise a "quad illumination aperture" such as already described.

Figure 14A:
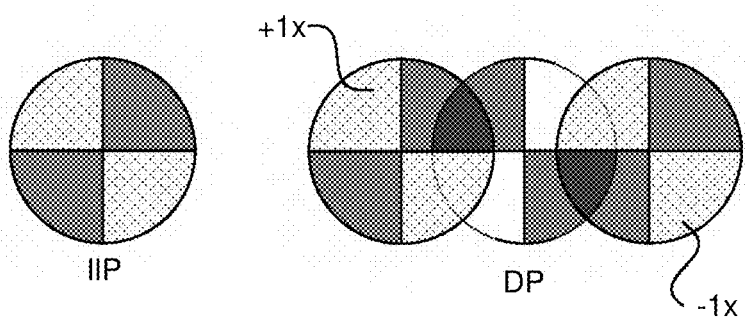
FIGS. 14A-14B show FIG. 14A an illumination and detection arrangement usable in a method for digitally separating diffraction orders according to an embodiment of the invention and FIG. 14B a flowchart describing a method for digitally separating diffraction orders according to an embodiment of the invention.
Figure 14B:
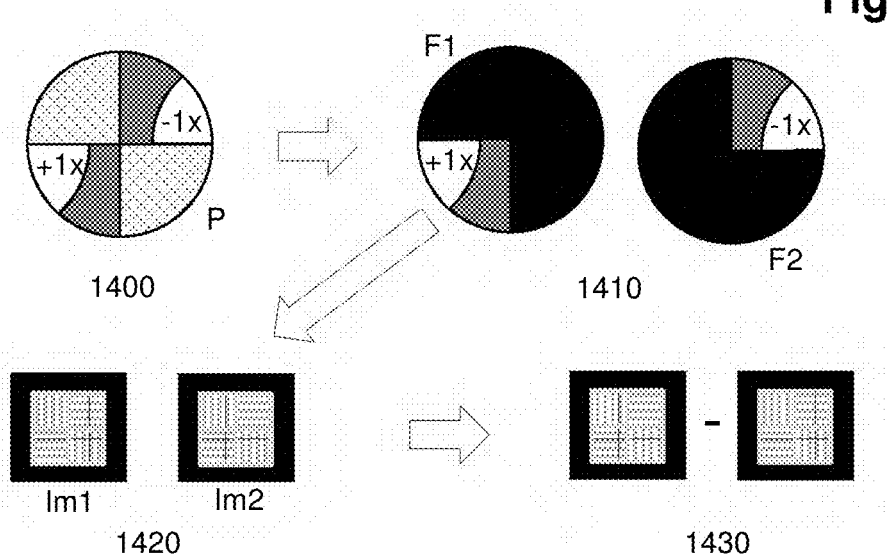
Figure 15:
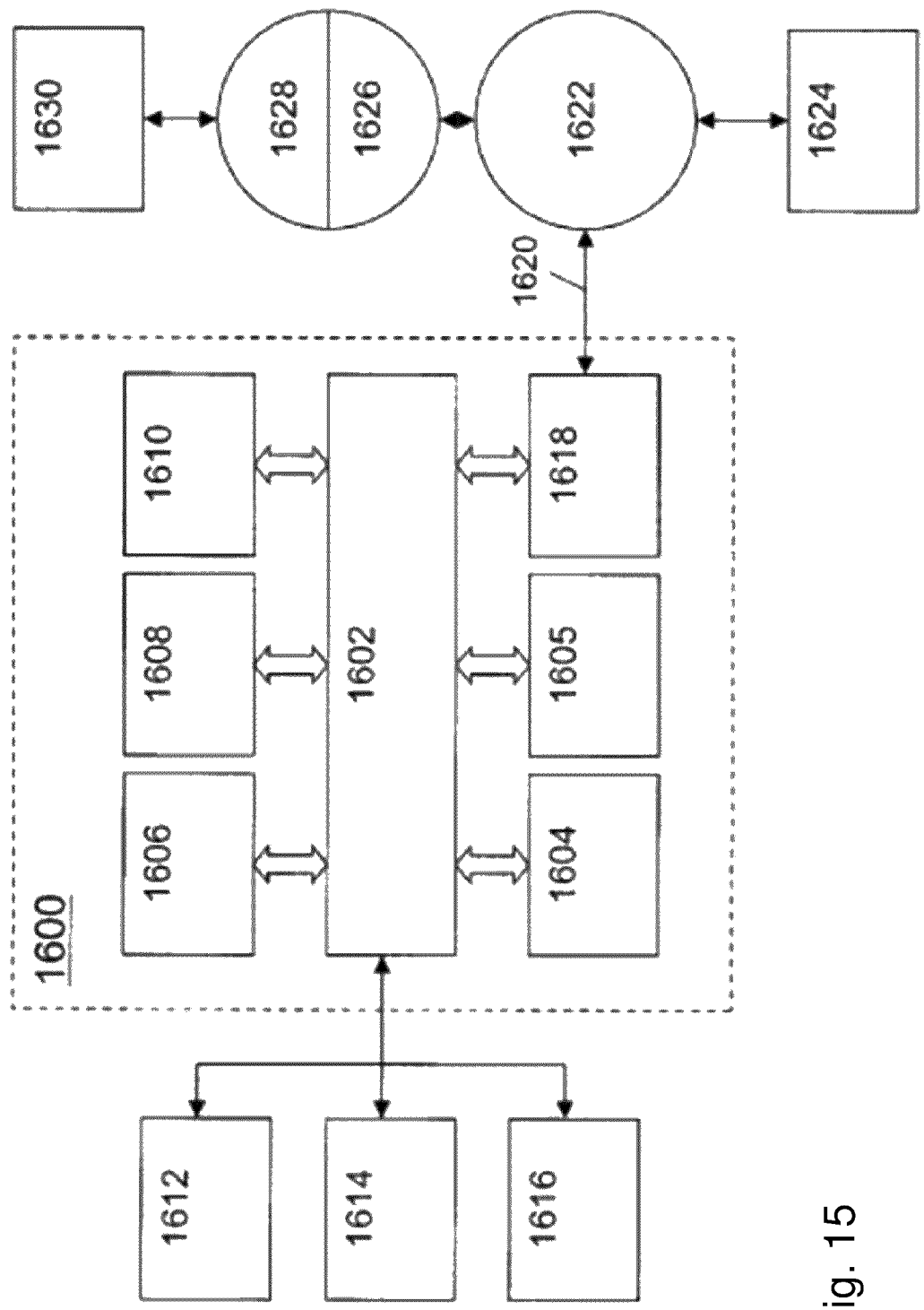
FIG. 15 is a block diagram that illustrates a computer system.

This separation allows to apply a digital equivalent of the aforementioned optical wedge in a Computational Imaging sensor concept. FIG. 14(a) shows an exemplary illumination pupil IIP and detection pupil DP arrangement showing a possible location of +1 and −1 diffraction orders (only one direction shown) with respect to the detection pupil DP. FIG. 14(b) is a flowchart describing such an outline metrology method according to this concept:

Step 1400: Reconstruct a pupil representation P describing the electric field in the pupil plane using computational imaging (e.g., based on radiation information obtained from the illumination and detection arrangements of FIG. 14(a)).

Step 1410: Apply two separation filters F1, F2 to the reconstructed pupil plane, so as to separate the opposing diffraction orders (e.g., +1X order signal and the −1X order signal) in the pupil, thereby providing two pupil images which are substantially complementary (relate to normal and complementary modes respectively). The filtering may be performed based on pupil location as the approximate location within the pupil of each diffraction order will be known. The separation filters may be implemented in hardware or software.

Step 1420: Reconstruct (digitally reimage) each of the pupil images Im1, Im2 to a field plane representation.

Step 1430: Apply an algorithm to determine asymmetry between the $+1^{st}$ and $-1^{st}$ order, where the asymmetry can be in terms of intensity or phase of the electric field, or a combination of both.

As is done presently in diffraction based overlay (DBO), two biased targets can be used to calibrate the sensitivity of the signal asymmetry to overlay.

In case of large pitches for which second order diffraction or higher is captured on the camera, these individual orders can also be separated. For each order the image can be processed independently to infer overlay.

When gratings with different pitches are present in the field-of-view, e.g. different pitches between X and Y or multi-layer targets, the pupil filtering can also be used to separately image these individual pitches. This will reduce the cross-talk between these structures.

Using computational imaging, no additional hardware is required to separate the orders or to create the flexibility to use normal/complementary modes simultaneously. Computational reimaging also provides more freedom in the choice of separating filter, such that a filter with hard edges or soft edges can be chosen (e.g. to avoid diffraction effect at those edges (apodization)).

The above embodiments may be used to solve a problem in the computational imaging, which may be a crosstalk problem caused by using coherent illumination as mentioned above. In one embodiment, the above embodiments may use the software domain to solve a hardware problem, taking full advantage of using algorithms in the computational imaging. The above embodiments may allow to remove or suppress unwanted areas in the Fourier domain or called the pupil plane, lowering impact of crosstalk. The above embodiments may be suited for the cases when non-target structure pitch is, optionally sufficiently, different from the target pitch. The above embodiments may not require any apriori knowledge since the images obtained from phase retrieval method provide all the information to specify the filter. The above embodiments may be expected to be robust against uncalibrated or called residual wavefront aberrations, which is because that such aberrations may not affect the locations of non-target structure and target signals in the pupil space.

The above-mentioned embodiments may be provided in a metrology apparatus, e.g. of FIG. 5, an inspection apparatus, a lithographic apparatus, e.g. of FIG. 1, and/or a lithographic cell, e.g. of FIG. 2.

In another embodiment, there is a computer program product comprising instructions which cause, when executed at a processor, the execution of the method of the above-mentioned embodiments.

Further embodiments are disclosed in the subsequent numbered clauses:

1. A method for a metrology measurement on an area of a substrate comprising at least a portion of a target structure, the method comprising
   receiving a radiation information representing at least a portion of radiation scattered by the area,
   using a filter in a Fourier domain for removing or suppressing at least a portion of the received radiation information that does not relate to radiation that has been scattered by the target structure for obtaining a filtered radiation information for the metrology measurement,
wherein characteristics of the filter are based on target information about the target structure.

2. A method according to clause 1, wherein the target information comprises at least one of a target structure size (A) and a slope of phase gradient ($k_{x,y}$).

3. A method according to clause 1 or 2, wherein the characteristics of the filter comprise at least one of a central frequency of the filter ($NA_{x,y}$) and a width of the filter ($NA_w$) in the Fourier domain.

4. A method according to clauses 2 and 3, wherein the width of the filter is inversely proportional to the target structure size and is given by the expression:

$$NA_w \propto \lambda/A$$

where $\lambda$ is wavelength of the radiation.

5. A method according to any preceding clause when referring to clauses 2 and 3, wherein the central frequency of the filter in the Fourier domain is based on the slope of phase gradient, wherein $$NA_{x,y} = \frac{k_{x,y}}{2\pi/\lambda}$$

where $\lambda$ is wavelength of the radiation.

6. A method according to any preceding clause, wherein the method comprising obtaining a complex electric field from the received radiation information by a phase retrieval method, optionally a direct phase retrieval measurement or an indirect phase retrieval measurement, optionally the indirect phase retrieval measurement is using a phase retrieval algorithm.

7. A method according to clause 6, wherein the method comprising the act of the Fourier transforming the complex field.

8. A method according to any preceding clause, wherein the method comprising obtaining a phase signal comprising the target information.

9. A method according to clause 2 and clause 8, wherein the target information obtained from the phase signal comprising the target structure size and the slope of phase gradient.

10. A method according to any preceding clause, wherein the method comprising obtaining a pupil image of the received radiation information in the Fourier domain.

11. A method according to clause 10, wherein the method comprising subsequently performing an inverse Fourier transform using the filtered radiation information to recompute a filtered image.

12. A method according to any preceding clause, wherein the target information comprises a pitch of the target structure.

13. A method according to clause 12, wherein a non-target structure in the area do not have the pitch of the target structure.

14. A method according to any preceding clause, wherein the method comprising providing an incident radiation emitted by a radiation source.

15. A method according to any preceding clause, wherein the method comprising detecting the radiation information with a detector.

16. A method according to any preceding clause, wherein the received radiation information comprises information of one or more non-zeroth order diffraction components scattered from the target structure.

17. A method according to any preceding clause, wherein a transmission function of the filter is such that it is flat in middle and softly roll-off at its edges.

18. A method according to any preceding clause, wherein the incident radiation is fully spatially coherent or partially spatially coherent.

19. A method according to any preceding clause, wherein the filter is an amplitude filter.

20. A method according to any preceding clause, wherein the filter is an algorithm in software domain.

21. A method according to any one of the clauses 1 to 19, wherein the filter is a hardware filter.

22. A method according to any preceding clause, wherein there is a separation in the Fourier domain between a first portion of the received radiation information that is scattered by the target structure and a second portion of the received radiation information that is not scattered by the target structure.

23. A method according to any preceding clause, the method further comprising:
   using one or more filters in the Fourier domain for separating at least one pair of opposing higher diffraction orders within said at least a portion of radiation scattered by the area.

24. A method according to clause 23, wherein said radiation information relates to radiation obtained in a normal illumination mode and in a complementary illumination mode.

25. A method according to clause 23 or 24, comprising the steps of:
   applying digital separation filters to a pupil representation reconstructed from the radiation information, the digital separation filters being operable to separate the at least one pair of opposing diffraction orders in the pupil; and
   reconstructing pupil images respectively corresponding to each of said opposing diffraction orders in a field plane.

26. A method according to clause 25, wherein the digital separation filters are applied based on pupil location.

27. A method according to any of clauses 23 to 26, comprising determining asymmetry between the opposing diffraction orders, said asymmetry comprising asymmetry of intensity, phase or a combination of intensity and phase.

28. A method according to any of clauses 23 to 27, wherein said radiation information comprises information relating to a plurality of pairs of opposing diffraction orders; and said method comprises applying said filters to separate each of these diffraction orders.

29. A method according to any preceding clause, comprising performing a pupil region of interest optimization step to optimize the region within said Fourier domain at which said filter is used for said removing or suppressing.

30. A method according to clause 29, wherein the pupil region of interest optimization step comprises performing iterations of:
reconstructing a pupil representation from the radiation information and/or simulating a pupil representation based on reticle data describing structures on the reticle;
determining a region of interest to be evaluated and filtering the pupil representation according to this region of interest;
determining a filtered image for the filtered pupil representation; and
evaluating the filtered image against filtered images of previous iterations.

31. A method according to clause 30, wherein the determining a region of interest to be evaluated comprises freely selecting a region or performing a clustering algorithm to identify regions for evaluation.

32. A method according to clause 30 or 31, wherein the evaluating step comprises one or both of: evaluating the stability of the region of interest to be evaluated; and evaluating intra-wafer variation of diffracted intensities in either the pupil or field plane.

33. A method according to any of clauses 29 to 32, wherein the pupil region of interest optimization step is performed at machine setup, at recipe setup; at the start of every lot; or at the start of every wafer.

34. A method according to any of clauses 29 to 33 wherein the pupil region of interest optimization step is performed at each time a triggering event occurs.

35. A method for a metrology measurement on an area of a substrate comprising at least a portion of a target structure, the method comprising:
receiving radiation information representing at least a portion of radiation scattered by the area, and
using one or more filters in a Fourier domain for separating at least one pair of opposing higher diffraction orders within said at least a portion of radiation scattered by the area.

36. A method according to clause 35, wherein said radiation information relates to radiation obtained in a normal illumination mode and in a complementary illumination mode.

37. A method according to clause 35 or 36, comprising the steps of:
applying digital separation filters to a pupil representation reconstructed from the radiation information, the digital separation filters being operable to separate the at least one pair of opposing diffraction orders in the pupil; and
reconstructing pupil images respectively corresponding to each of said opposing diffraction orders in a field plane.

38. A method according to clause 37, wherein the digital separation filters are applied based on pupil location.

39. A method according to any of clauses 35 to 38, comprising determining asymmetry between the opposing diffraction orders, said asymmetry comprising asymmetry of intensity, phase or a combination of intensity and phase.

40. A method according to any of clauses 35 to 39, wherein said radiation information comprises information relating to a plurality of pairs of opposing diffraction orders; and said method comprises applying said filters to separate each of these diffraction orders.

41. A method according to any preceding clause, wherein the metrology measurement is to determine a characteristic of the target structure.

42. A method according to clause 41, wherein the characteristic of the target structure is one of overlay, focus and critical dimension.

43. A metrology apparatus for a metrology measurement on an area of a substrate comprising at least a portion of a target structure, the metrology apparatus being configured for:
receiving a radiation information representing at least a portion of radiation scattered by the area,
using a filter in a Fourier domain for removing or suppressing at least a portion of the received radiation information that does not relate to radiation that has been scattered by the target structure for obtaining a filtered radiation information for the metrology measurement,
wherein characteristics of the filter are based on target information about the target structure.

44. A metrology apparatus for a metrology measurement on an area of a substrate comprising at least a portion of a target structure, the metrology apparatus comprising a processor being configured to execute instruction for performing the steps of:
receiving a radiation information representing at least a portion of radiation scattered by the area,
using a filter in a Fourier domain for removing or suppressing at least a portion of the received radiation information that does not relate to radiation that has been scattered by the target structure for obtaining a filtered radiation information for the metrology measurement,
wherein characteristics of the filter are based on target information about the target structure.

45. A metrology apparatus for a metrology measurement on an area of a substrate comprising a target structure, the metrology apparatus comprising
source for illuminating the area on the substrate,
a detection system for receiving a radiation information representing at least a portion of radiation scattered by the area,
the detection system comprising a filter in the pupil plane for removing or suppressing at least a portion of the received radiation information that does not relate to radiation that has been scattered by the target structure for obtaining a filtered radiation information for the metrology measurement,
wherein characteristics of the filter are based on target information about the target structure.

46. A computer program product comprising instructions which cause, when executed at a processor, the execution of the method of any of clauses 1 to 42.

47. A metrology apparatus for a metrology measurement on an area of a substrate comprising at least a portion of a target structure, the metrology apparatus being configured to the method of any of clauses 1 to 42.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments in the context of a lithographic apparatus, embodiments may be used in other apparatus. Embodiments may form part of a mask inspection apparatus, a metrology apparatus, or any apparatus that measures or processes an object such as a wafer (or other substrate) or mask (or other patterning device). These apparatuses may be generally referred to as lithographic tools. Such a lithographic tool may use vacuum conditions or ambient (non-vacuum) conditions.

Although specific reference may be made in this text to embodiments in the context of an inspection or metrology apparatus, embodiments may be used in other apparatus. Embodiments may form part of a mask inspection apparatus, a lithographic apparatus, or any apparatus that measures or processes an object such as a wafer (or other substrate) or mask (or other patterning device). The term "metrology apparatus" (or "inspection apparatus") may also refer to an inspection apparatus or an inspection system (or a metrology apparatus or a metrology system). E.g. the inspection apparatus that comprises an embodiment may be used to detect defects of a substrate or defects of structures on a substrate. In such an embodiment, a characteristic of interest of the structure on the substrate may relate to defects in the structure, the absence of a specific part of the structure, or the presence of an unwanted structure on the substrate.

Although specific reference may have been made above to the use of embodiments in the context of optical lithography, it will be appreciated that the invention, where the context allows, is not limited to optical lithography and may be used in other applications, for example imprint lithography.

While the targets or target structures (more generally structures on a substrate) described above are metrology target structures specifically designed and formed for the purposes of measurement, in other embodiments, properties of interest may be measured on one or more structures which are functional parts of devices formed on the substrate. Many devices have regular, grating-like structures. The terms structure, target grating and target structure as used herein do not require that the structure has been provided specifically for the measurement being performed. Further, pitch of the metrology targets may be close to the resolution limit of the optical system of the scatterometer or may be smaller, but may be much larger than the dimension of typical non-target structures optionally product structures made by lithographic process in the target portions C. In practice the lines and/or spaces of the overlay gratings within the target structures may be made to include smaller structures similar in dimension to the non-target structures.

While specific embodiments have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Although specific reference is made to "metrology apparatus/tool/system" or "inspection apparatus/tool/system", these terms may refer to the same or similar types of tools, apparatuses or systems. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

FIG. 13 is a block diagram that illustrates a computer system 1600 that may assist in implementing the methods and flows disclosed herein. Computer system 1600 includes a bus 1602 or other communication mechanism for communicating information, and a processor 1604 (or multiple processors 1604 and 1605) coupled with bus 1602 for processing information. Computer system 1600 also includes a main memory 1606, such as a random access memory (RAM) or other dynamic storage device, coupled to bus 1602 for storing information and instructions to be executed by processor 1604. Main memory 1606 also may be used for storing temporary variables or other intermediate information during execution of instructions to be executed by processor 1604. Computer system 1600 further includes a read only memory (ROM) 1608 or other static storage device coupled to bus 1602 for storing static information and instructions for processor 1604. A storage device 1610, such as a magnetic disk or optical disk, is provided and coupled to bus 1602 for storing information and instructions.

Computer system 1600 may be coupled via bus 1602 to a display 1612, such as a cathode ray tube (CRT) or flat panel or touch panel display for displaying information to a computer user. An input device 1614, including alphanumeric and other keys, is coupled to bus 1602 for communicating information and command selections to processor 1604. Another type of user input device is cursor control 1616, such as a mouse, a trackball, or cursor direction keys for communicating direction information and command selections to processor 1604 and for controlling cursor movement on display 1612. This input device typically has two degrees of freedom in two axes, a first axis (e.g., x) and a second axis (e.g., y), that allows the device to specify positions in a plane. A touch panel (screen) display may also be used as an input device.

One or more of the methods as described herein may be performed by computer system 1600 in response to processor 1604 executing one or more sequences of one or more instructions contained in main memory 1606. Such instructions may be read into main memory 1606 from another computer-readable medium, such as storage device 1610. Execution of the sequences of instructions contained in main memory 1606 causes processor 1604 to perform the process steps described herein. One or more processors in a multi-processing arrangement may also be employed to execute the sequences of instructions contained in main memory 1606. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 1604 for execution. Such a medium may take many forms, including but not limited to, non-volatile media, volatile media, and transmission media. Non-volatile media include, for example, optical or magnetic disks, such as storage device 1610. Volatile media include dynamic memory, such as main memory 1606. Transmission media include coaxial cables, copper wire and fiber optics, including the wires that comprise bus 1602. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 1604 for execution. For example, the instructions may initially be borne on a magnetic disk of a remote computer. The remote computer can load the instructions into its dynamic memory and send the instructions over a telephone line using a modem. A modem local to computer system 1600 can receive the data on the telephone line and use an infrared transmitter to convert the data to an infrared signal. An infrared detector coupled to bus 1602 can receive the data carried in the infrared signal and place the data on bus 1602. Bus 1602 carries the data to main memory 1606, from which processor 1604 retrieves and executes the instructions. The instructions received by main memory 1606 may optionally be stored on storage device 1610 either before or after execution by processor 1604.

Computer system 1600 also preferably includes a communication interface 1618 coupled to bus 1602. Communication interface 1618 provides a two-way data communication coupling to a network link 1620 that is connected to a local network 1622. For example, communication interface 1618 may be an integrated services digital network (ISDN) card or a modem to provide a data communication connection to a corresponding type of telephone line. As another example, communication interface 1618 may be a local area network (LAN) card to provide a data communication connection to a compatible LAN. Wireless links may also be implemented. In any such implementation, communication interface 1618 sends and receives electrical, electromagnetic or optical signals that carry digital data streams representing various types of information.

Network link 1620 typically provides data communication through one or more networks to other data devices. For example, network link 1620 may provide a connection through local network 1622 to a host computer 1624 or to data equipment operated by an Internet Service Provider (ISP) 1626. ISP 1626 in turn provides data communication services through the worldwide packet data communication network, now commonly referred to as the "Internet" 1628. Local network 1622 and Internet 1628 both use electrical, electromagnetic or optical signals that carry digital data streams. The signals through the various networks and the signals on network link 1620 and through communication interface 1618, which carry the digital data to and from computer system 1600, are exemplary forms of carrier waves transporting the information.

Computer system 1600 may send messages and receive data, including program code, through the network(s), network link 1620, and communication interface 1618. In the Internet example, a server 1630 might transmit a requested code for an application program through Internet 1628, ISP 1626, local network 1622 and communication interface 1618. One such downloaded application may provide for one or more of the techniques described herein, for example. The received code may be executed by processor 1604 as it is received, and/or stored in storage device 1610, or other non-volatile storage for later execution. In this manner, computer system 1600 may obtain application code in the form of a carrier wave.

The invention claimed is:

1. A method for a metrology measurement on an area of a substrate comprising at least a portion of a target structure, the method comprising:
   receiving, at an image plane, radiation information representing at least a portion of both the target structure and non-target structure dark field diffraction radiation scattered by the area;
   converting the received radiation information in a pupil plane or Fourier domain;
   using a filter in the pupil plane or Fourier domain to remove or suppress at least a portion of the received radiation information that does not relate to radiation that has been scattered by the target structure to obtain a filtered radiation information for the metrology measurement, wherein characteristics of the filter are based on target information about the target structure;
   converting the filtered radiation information into image data; and
   using the image data to adjust a parameter of interest of a semiconductor process.

2. The method of claim 1, wherein the target information comprises at least one of a target structure size (A) and a slope of phase gradient ($k_{x,y}$).

3. The method of claim 2, wherein a width of the filter is inversely proportional to the target structure size and is given by the expression:

$$NA_w \propto \lambda/A$$

where $\lambda$ is wavelength of the radiation.

4. The method of claim 2, wherein the target information is obtained from the phase signal comprising the target structure size and the slope of phase gradient.

5. The method of claim 1, wherein the characteristics of the filter comprise at least one of a central frequency of the filter ($NA_{x,y}$) and a width of the filter ($NA_w$) in the Fourier domain.

6. The method of claim 1, wherein a central frequency of the filter in the Fourier domain is based on the slope of phase gradient and is given by the expression:

$$NA_{x,y} = \frac{k_{x,y}}{2\pi/\lambda}$$

where $\lambda$ is wavelength of the radiation.

7. The method of claim 1, further comprising obtaining a complex electric field from the received radiation information by a phase retrieval method, a direct phase retrieval measurement or an indirect phase retrieval measurement, wherein the indirect phase retrieval measurement is derived using a phase retrieval algorithm.

8. The method of claim 7, wherein the method comprises Fourier transforming the complex electric field.

9. The method of claim 1, wherein the method comprises obtaining a phase signal comprising the target information.

10. The method of claim 1, wherein the target information comprises a pitch of the target structure.

11. The method of claim 1, wherein a transmission function of the filter is such that it is flat in the middle and softly roll-off at its edges.

12. The method of claim 1, the method further comprising:
   using one or more filters in the Fourier domain for separating at least one pair of opposing higher diffraction orders within at least a portion of radiation scattered by the area.

13. The method of claim 1, comprising performing a pupil region of interest optimization to optimize a region within the Fourier domain, wherein the filter is used for the removing or suppressing of the at least a portion of the received radiation information.

14. A method for a metrology measurement on an area of a substrate comprising at least a portion of a target structure, the method comprising:
  receiving, at an image plane, radiation information representing at least a portion of both the target structure and non-target structure dark field diffraction radiation scattered by the area;
  converting the received radiation information in a pupil plane or Fourier domain;
  using one or more filters in the pupil plan or Fourier domain to remove or suppress at least one pair of opposing higher diffraction orders within at least a portion of radiation scattered by the area to generate image data; and
  using the image data to adjust a parameter of interest of a semiconductor process.

15. A metrology apparatus for a metrology measurement on an area of a substrate comprising at least a portion of a target structure, the metrology apparatus being configured to:
  receive, at an image plane, a radiation information representing at least a portion of both the target structure and non-target structure dark field diffraction radiation scattered by the area;
  convert the received radiation information in a pupil plane or Fourier domain;
  use a filter in the pupil plane of Fourier domain to remove or suppress at least a portion of the received radiation information that does not relate to radiation that has been scattered by the target structure to obtain a filtered radiation information for the metrology measurement, wherein characteristics of the filter are based on target information about the target structure;
  convert the filtered radiation information into image data; and
  use the image data to adjust a parameter of interest of a semiconductor process.

* * * * *

UNITED STATES PATENT AND TRADEMARK OFFICE
CERTIFICATE OF CORRECTION

PATENT NO. : 12,405,535 B2
APPLICATION NO. : 17/761475
DATED : September 2, 2025
INVENTOR(S) : Koolen et al.

Page 1 of 1

It is certified that error appears in the above-identified patent and that said Letters Patent is hereby corrected as shown below:

In the Claims

In Column 32, Claim 3, Line 29, delete "is" and insert -- is a --, therefor.

In Column 32, Claim 6, Line 46, delete "is" and insert -- is a --, therefor.

Signed and Sealed this
Thirtieth Day of September, 2025

John A. Squires
*Director of the United States Patent and Trademark Office*